US012755762B2

(12) United States Patent
Lee

(10) Patent No.: US 12,755,762 B2
(45) Date of Patent: Oct. 6, 2026

(54) POWER SUPPLY CIRCUIT, SEMICONDUCTOR DEVICE AND ELECTRONIC DEVICE

(71) Applicant: SK hynix Inc., Gyeonggi-do (KR)

(72) Inventor: Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 155 days.

(21) Appl. No.: 18/749,616

(22) Filed: Jun. 21, 2024

(65) Prior Publication Data

US 2025/0259658 A1 Aug. 14, 2025

(30) Foreign Application Priority Data

Feb. 8, 2024 (KR) ........................ 10-2024-0019394

(51) Int. Cl.
*G11C 5/14* (2006.01)
*G11C 5/02* (2006.01)
*G11C 16/30* (2006.01)

(52) U.S. Cl.
CPC .............. *G11C 5/147* (2013.01); *G11C 5/025* (2013.01); *G11C 16/30* (2013.01)

(58) Field of Classification Search
CPC ......... G11C 5/147; G11C 5/025; G11C 16/30; G11C 5/04; G11C 5/14; G11C 5/145; G11C 5/143; G06F 1/26; G06F 1/3275; H01L 23/64; H10W 44/00
USPC .......................................................... 365/226
See application file for complete search history.

(56) References Cited

U.S. PATENT DOCUMENTS

| | | | | |
|---|---|---|---|---|
| 11,152,046 | B1 | 10/2021 | Raszka et al. | |
| 2008/0043510 | A1 | 2/2008 | Tomita | |
| 2013/0193590 | A1 | 8/2013 | Bartoli et al. | |
| 2019/0115053 | A1 | 4/2019 | Park et al. | |
| 2022/0254418 | A1 | 8/2022 | Lin et al. | |
| 2024/0055030 | A1 * | 2/2024 | Cheon | G11C 29/028 |

FOREIGN PATENT DOCUMENTS

| | | | | |
|---|---|---|---|---|
| CN | 115116499 A * | 9/2022 | G11C 5/147 |
| KR | 10-0299254 B1 | 9/2001 | |
| KR | 10-2023-0038971 A | 3/2023 | |

OTHER PUBLICATIONS

Partial European Search Report for European Patent Application No. 24218919.9 issued by the European Patent Office on Jun. 12, 2025.
Extended European Search Report for European Patent Application No. 24218919.9 issued by the European Patent Office on Nov. 7, 2025.

* cited by examiner

*Primary Examiner* — Fernando Hidalgo
(74) *Attorney, Agent, or Firm* — IP&T GROUP LLP

(57) ABSTRACT

Embodiments of the present disclosure may provide a storage device including a semiconductor package on which a memory and a power supply circuit are disposed. The power supply circuit included in the semiconductor package may control supply of an internal driving voltage based on whether an external driving voltage is supplied, and the efficiency of supplying a voltage for driving the semiconductor package may be improved by adjusting supply of the internal driving voltage depending on an operation state of the memory.

19 Claims, 15 Drawing Sheets

POWER SUPPLY CIRCUIT, SEMICONDUCTOR DEVICE AND ELECTRONIC DEVICE

CROSS-REFERENCE TO RELATED APPLICATION

This patent application claims priority under 35 U.S.C. § 119 (a) to Korean Patent Application No. 10-2024-0019394 filed on Feb. 8, 2024, which is incorporated herein by reference in its entirety.

BACKGROUND

1. Technical Field

Various embodiments of the present disclosure generally relate to a power supply circuit, a semiconductor device and an electronic device.

2. Related Art

A storage device may include at least one memory which stores data. The storage device may include a controller (i.e., a memory controller) which controls operations of the memory. The controller may control an operation of writing data to the memory and an operation of reading data written to the memory.

The memory and the controller included in the storage device may be provided as a single semiconductor package. Alternatively, the memory and the controller may be provided in separate semiconductor packages.

As such, the types of the storage device may be various, and a power source which supplies a voltage for driving the memory and the controller may be required in the various types of the storage device. Measures capable of efficiently controlling the power source according to the various types of the storage device are required.

SUMMARY

Various embodiments of the present disclosure are directed to providing measures capable of efficiently disposing and managing a power source which supplies a driving voltage to at least one of a memory and a controller included in a storage device.

In an embodiment of the present disclosure, a semiconductor device may include a package substrate including a plurality of package balls; at least one memory electrically connected to a first driving voltage package ball among the plurality of package balls through a first external voltage interconnection; and a power supply circuit electrically connected to the first driving voltage package ball through the first external voltage interconnection, electrically connected to the at least one memory through a first internal voltage interconnection, and configured to adjust a voltage state of the first internal voltage interconnection based on a voltage level of the first driving voltage package ball.

In an embodiment of the present disclosure, an electronic device may include a semiconductor package; and a power management circuit configured to supply an external driving voltage through a package ball included in the semiconductor package, the semiconductor package including at least one memory; a power supply circuit configured to supply an internal driving voltage to the at least one memory; and a first external voltage interconnection electrically connected to the at least one memory and the power supply circuit, and electrically connected to a package ball which is electrically separated from the power management circuit.

In an embodiment of the present disclosure, an electronic device may include a semiconductor package; and a power management circuit configured to supply an external driving voltage through a package ball included in the semiconductor package, the semiconductor package including at least one memory; a power supply circuit configured to supply an internal driving voltage to the at least one memory; a first external voltage interconnection electrically connected between a package ball which is electrically connected to the power management circuit and the at least one memory, and electrically connected to the power supply circuit; and a first internal voltage interconnection electrically connected between the power supply circuit and the at least one memory.

According to the embodiments of the present disclosure, it is possible to efficiently dispose and manage a power source which supplies a voltage for driving a memory, etc., according to various types of a storage device including the memory or the memory and a controller.

DETAILED DESCRIPTION

Figure 1:
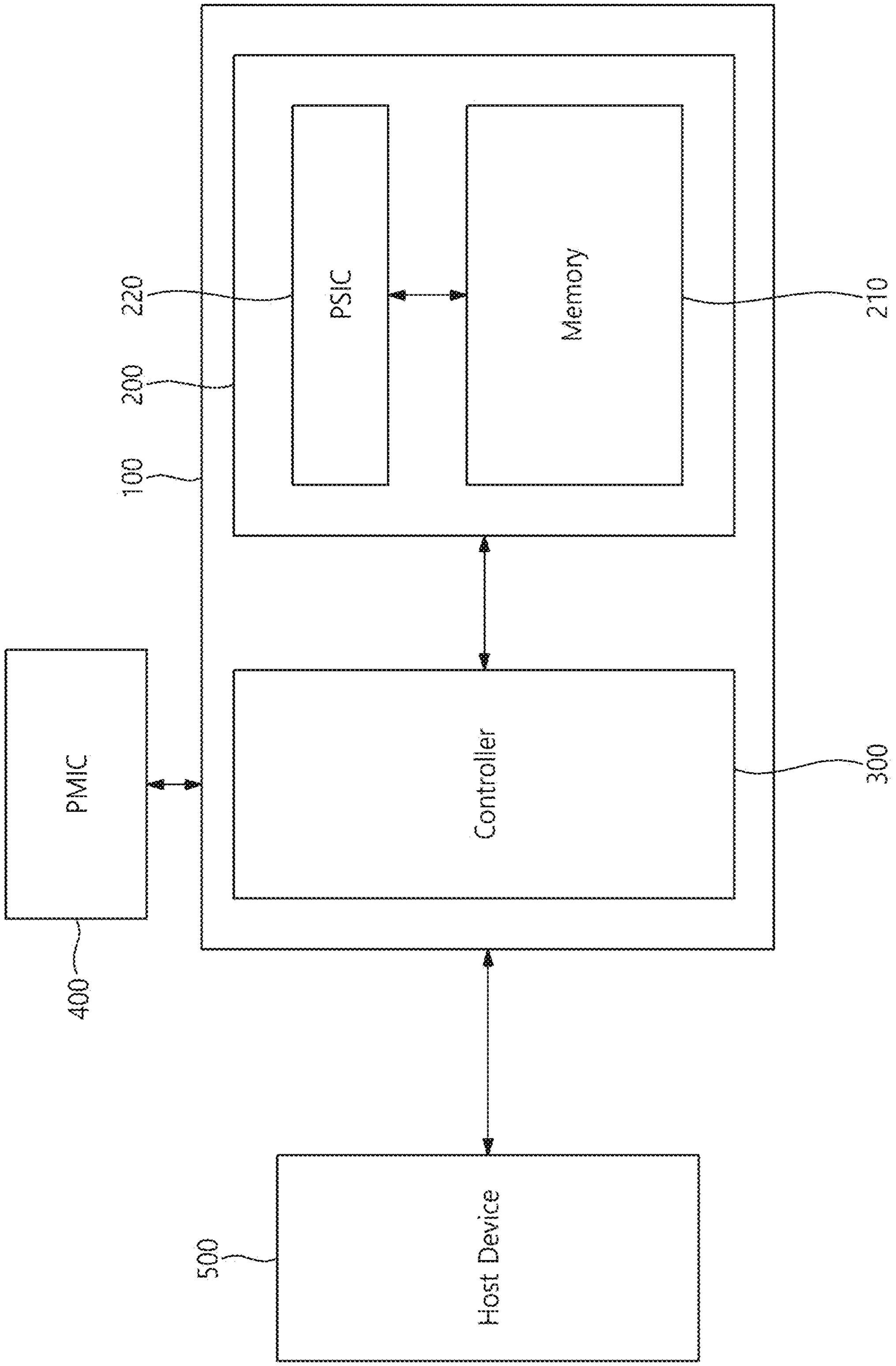
FIG. 1 is a diagram illustrating a configuration of a storage device according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element may be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms may be used to describe non-consecutive or non-sequential processes or operations unless the term “directly” or “immediately” is used together.

In addition, when any dimensions, relative sizes etc. are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term “may” fully encompasses all meanings of the term “can”.

Hereinafter, various embodiments of the present disclosure will be described in detail with reference to accompanying drawings.

FIG. 1 is a diagram illustrating a configuration of a storage device 100 according to an embodiment of the present disclosure.

Referring to FIG. 1, the storage device 100 may include at least one memory 210. The storage device 100 may include a controller 300 which controls operations of the memory 210.

The memory 210 and the controller 300 may be a semiconductor chip (or a semiconductor die). The memory 210 and the controller 300 may be provided as separate packages. For example, the memory 210 may be provided in a form of a semiconductor package 200. In the present disclosure, the semiconductor package 200 may be referred to as a semiconductor device. The controller 300 may be implemented as a single chip or, as the case may be, implemented in a form including a plurality of chiplets. In the latter case, each of the plurality of chiplets may perform at least a part of functions to be performed by the controller 300.

For example, the memory 210 may be implemented in various types such as a NAND flash memory, a 3D NAND flash memory, a NOR flash memory, a resistive random access memory, a phase-change random access memory, a magnetoresistive random access memory, a ferroelectric random access memory and a spin transfer torque random access memory, but the embodiments of the present disclosure are not limited thereto. The memory 210 may be implemented into a three-dimensional array structure. The embodiments of the present disclosure may be applied to not only a flash memory in which a charge storage layer is configured by a floating gate but also a charge trap flash in which a charge storage layer is configured by an insulating layer.

For another example, the memory 210 may be a volatile memory such as a DRAM, an SDRAM, a DDR SDRAM or an LPDDR SDRAM.

As the case may be, one part of the memory 210 included in the storage device 100 may be a nonvolatile memory, and the other part may be a volatile memory.

The controller 300 may control the operation of the memory 210 according to a command received from the outside or according to its own command.

The controller 300 may control an operation of writing data to the memory 210 or reading data written to the memory 210. Depending on the type of the memory 210, the controller 300 may control an operation of erasing data written to the memory 210 or an operation of refreshing data written to the memory 210.

The storage device 100 may be supplied with a voltage for driving, from a power management circuit (PMIC) 400 which is located outside. The storage device 100 may be supplied with at least one voltage from the power management circuit 400. The storage device 100 may use the voltage supplied from the power management circuit 400 as it is or by regulating the level of the voltage.

For example, the power management circuit 400 may be disposed on a printed circuit board on which the semiconductor package 200 and the controller 300 are mounted. Alternatively, the power management circuit 400 may be located in a host device 500 which processes data using the storage device 100 and controls the operation of the storage device 100.

As the case may be, the power management circuit 400 may be included in the storage device 100. The power management circuit 400 and the storage device 100 may be collectively referred to as an electronic device. Alternatively, the power management circuit 400, the storage device 100 and the host device 500 may be collectively referred to as an electronic device or a computing device.

The host device 500 may perform data processing while transmitting and receiving a command or data to and from the storage device 100.

For example, the host device 500 may be a computer, an ultra mobile PC (UMPC), a workstation, a personal digital assistant (PDA), a tablet, a mobile phone, a smartphone, a wearable device, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a telematics network, an RFID (radio frequency identification) device, a mobility device (e.g., a vehicle, a robot or a drone) capable of driving under human control or autonomous driving, or the like. Alternatively, the host device 500 may be a virtual/augmented reality device which provides a 2D or 3D virtual reality image or augmented reality image. Besides the examples described above, the host device 500 may be any one of various electronic devices which require the storage device 100 capable of storing data.

The host device 500 may include at least one operating system. The operating system may manage and control overall functions and operations of the host device 500. The operating system may control the interoperation between the host device 500 and the storage device 100. The operating system may be classified into a general operating system and a mobile operating system depending on the mobility of the host device 500.

The host device 500 may perform communication with the storage device 100 through various interfaces.

For example, the host device 500 may communicate with the storage device 100 through the Compute Express Link (CXL) interface. The host device 500 may be set as a CXL root port, and the storage device 100 may be set as a CXL end point. Since the host device 500 communicates with the storage device 100 through the CXL interface, a low-latency high-bandwidth access environment may be implemented in a structure which communicates with the storage device 100 of high capacity.

Alternatively, as the case may be, the host device 500 may communicate with the storage device 100 through an interface other than the CXL interface.

For example, the host device 500 and the storage device 100 may communicate through at least one among various communication interfaces or standards such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol and an IDE (integrated drive electronics) protocol, but the embodiments of the present disclosure are not limited thereto.

The type and number of host devices 500 which perform communication with the storage device 100 based on the embodiment of the present disclosure and the communication interface between the storage device 100 and the host device 500 may be various.

The storage device 100 may include a power supply circuit (PSIC) 220 which provides a voltage for driving the memory 210 and is able to efficiently manage the voltage.

For example, the power supply circuit 220 may be located outside the memory 210. The memory 210 and the power supply circuit 220 may be provided as the semiconductor package 200. The memory 210 and the power supply circuit 220 may be disposed on a substrate for packaging. For example, the semiconductor package 200 and the controller 300 may be disposed on a printed circuit board, and the memory 210 and the power supply circuit 220 may be disposed on the substrate of the semiconductor package 200.

The power supply circuit 220 may receive at least one voltage from the power management circuit 400 which is located outside the semiconductor package 200.

The power supply circuit 220 may supply a voltage for driving the memory 210, using the voltage received from the power management circuit 400. In the present disclosure, a voltage provided by the power management circuit 400 may be referred to as an external voltage or an external driving voltage, and a voltage provided by the power supply circuit 220 may be referred to as an internal voltage or an internal driving voltage.

The power supply circuit 220 may include, for example, a DC-DC converter such as a charge pump or a boost converter, but is not limited thereto.

The power supply circuit 220 may regulate the level of a voltage received from the power management circuit 400 and supply a voltage to the memory 210. As the case may be, a voltage supplied by the power management circuit 400 may be provided to the memory 210 to be used. Depending on the types of the storage device 100 and the semiconductor package 200, a method in which a voltage for driving the memory 210 Is supplied may be various.

The embodiment of the present disclosure may provide the structure of the semiconductor package 200 in which the memory 210 may operate using a voltage supplied by the power supply circuit 220 inside the semiconductor package 200 or a voltage supplied by the power management circuit 400 outside the semiconductor package 200.

Figure 2:
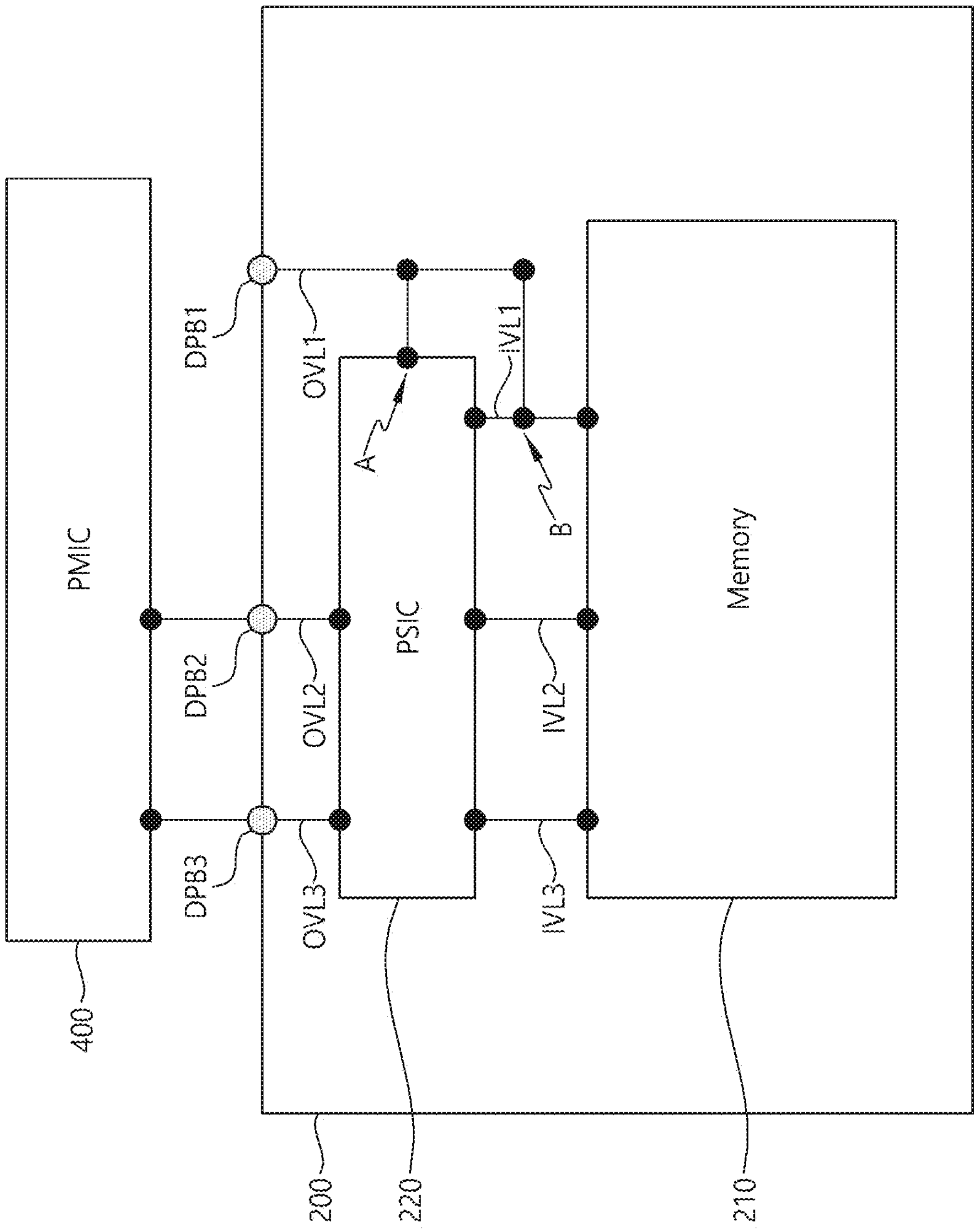
FIG. 2 is a diagram illustrating a configuration of a semiconductor package illustrated in FIG. 1, according to the embodiment of the present disclosure.

FIG. 2 is a diagram illustrating a configuration of the semiconductor package 200 illustrated in FIG. 1, according to the embodiment of the present disclosure.

Referring to FIG. 2, the semiconductor package 200 may include the memory 210 and the power supply circuit 220. The semiconductor package 200 may include plural memories.

The semiconductor package 200 may include one or more driving voltage package balls. For example, the driving voltage package balls may be included in the substrate of the semiconductor package 200. The driving voltage package balls may be located on the backside of the substrate on which the memory 210 and the power supply circuit 220 are disposed.

The semiconductor package 200 may include one or more external voltage interconnections which are electrically connected to the driving voltage package balls. The external voltage interconnections may be electrically connected between the driving voltage package balls and the power supply circuit 220.

The semiconductor package 200 may include one or more internal voltage interconnections which are electrically connected between the power supply circuit 220 and the memory 210.

The external voltage interconnections and the internal voltage interconnections described above may be disposed on the substrate of the semiconductor package 200.

At least a part of the driving voltage package balls of the semiconductor package 200 may be electrically connected to the power management circuit 400 which is located outside the semiconductor package 200. As the case may be, at least one of the driving voltage package balls of the semiconductor package 200 might not be electrically connected to the power management circuit 400.

For example, the semiconductor package 200 may include a first driving voltage package ball DPB1, a second driving voltage package ball DPB2 and a third driving voltage package ball DPB3.

The semiconductor package 200 may include a first external voltage interconnection OVL1, a second external voltage interconnection OVL2 and a third external voltage interconnection OVL3. The semiconductor package 200 may include a first internal voltage interconnection IVL1, a second internal voltage interconnection IVL2 and a third internal voltage interconnection IVL3.

The first external voltage interconnection OVL1 may electrically connect the first driving voltage package ball DPB1 and the power supply circuit 220. The first external voltage interconnection OVL1 may electrically connect the first driving voltage package ball DPB1 and the memory 210.

The second external voltage interconnection OVL2 may electrically connect the second driving voltage package ball DPB2 and the power supply circuit 220. The second external voltage interconnection OVL2 might not be electrically connected to the memory 210. The third external voltage interconnection OVL3 may electrically connect the third driving voltage package ball DPB3 and the power supply circuit 220. The third external voltage interconnection OVL3 might not be electrically connected to the memory 210.

The first internal voltage interconnection IVL1 may electrically connect the power supply circuit 220 and the memory 210.

The first internal voltage interconnection IVL1 may be electrically connected to the first external voltage interconnection OVL1.

Each of the second internal voltage interconnection IVL2 and the third internal voltage interconnection IVL3 may electrically connect the power supply circuit 220 and the memory 210.

The second internal voltage interconnection IVL2 may be disposed by being electrically or physically separated from the second external voltage interconnection OVL2. The third internal voltage interconnection IVL3 may be disposed by being electrically or physically separated from the third external voltage interconnection OVL3.

As such, only a partial external voltage interconnection among external voltage interconnections disposed on the semiconductor package 200 may be disposed by being electrically connected to an internal voltage interconnection or the memory 210.

A point where the first internal voltage interconnection IVL1 and the first external voltage interconnection OVL1 are connected may be located outside the power supply circuit 220.

A point where the first internal voltage interconnection IVL1 is connected to the memory 210 may be the same as a point where the first external voltage interconnection OVL1 is connected to the memory 210. A portion where the first internal voltage interconnection IVL1 is connected to the memory 210 and a portion where the first external voltage interconnection OVL1 is connected to the memory 210 may be integrated. That is, the first external voltage interconnection OVL1 may be connected to the memory 210 through the first internal voltage interconnection IVL1.

The first external voltage interconnection OVL1 which is electrically connected to the first driving voltage package ball DPB1 may be electrically connected to the power supply circuit 220 as indicated by 'A', and may be electrically connected to the first internal voltage interconnection IVL1 as indicated by 'B'.

A point where the first external voltage interconnection OVL1 is electrically or physically connected to the power supply circuit 220 may be located between the point where the first external voltage interconnection OVL1 is connected to the first internal voltage interconnection IVL1 and the first driving voltage package ball DPB1. The first external voltage interconnection OVL1 may be electrically connected to the power supply circuit 220 on a voltage path which extends from the first driving voltage package ball DPB1 to the memory 210.

Based on the structure in which the first external voltage interconnection OVL1 is electrically connected to the power supply circuit 220 and the memory 210 included in the semiconductor package 200, a driving voltage to be supplied to the memory 210 may be controlled according to the type of the storage device 100.

Figure 3:
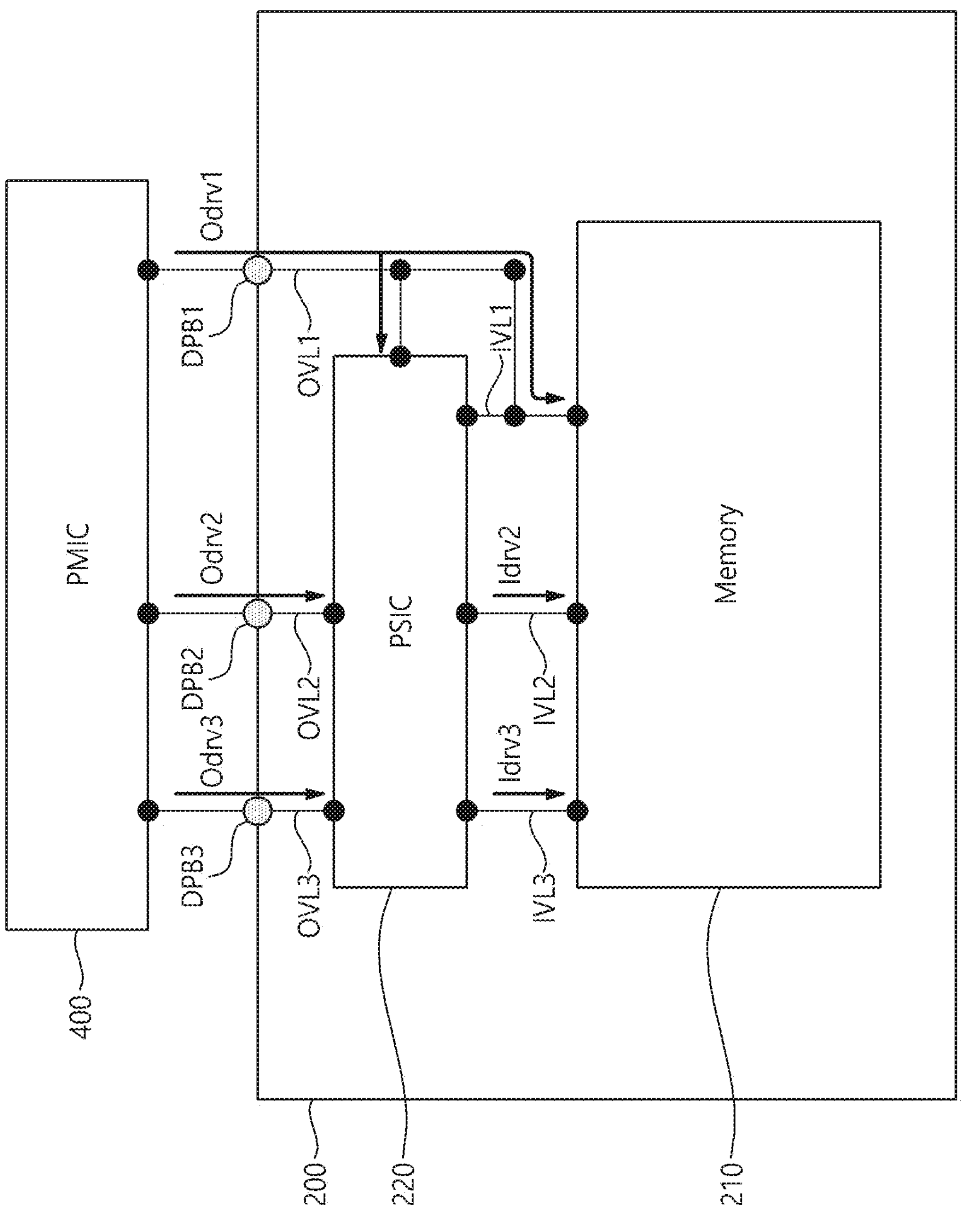
FIGS. 3 and 4 are diagrams for describing operation methods of the semiconductor package illustrated in FIG. 2, according to an embodiment of the present disclosure.
Figure 4:
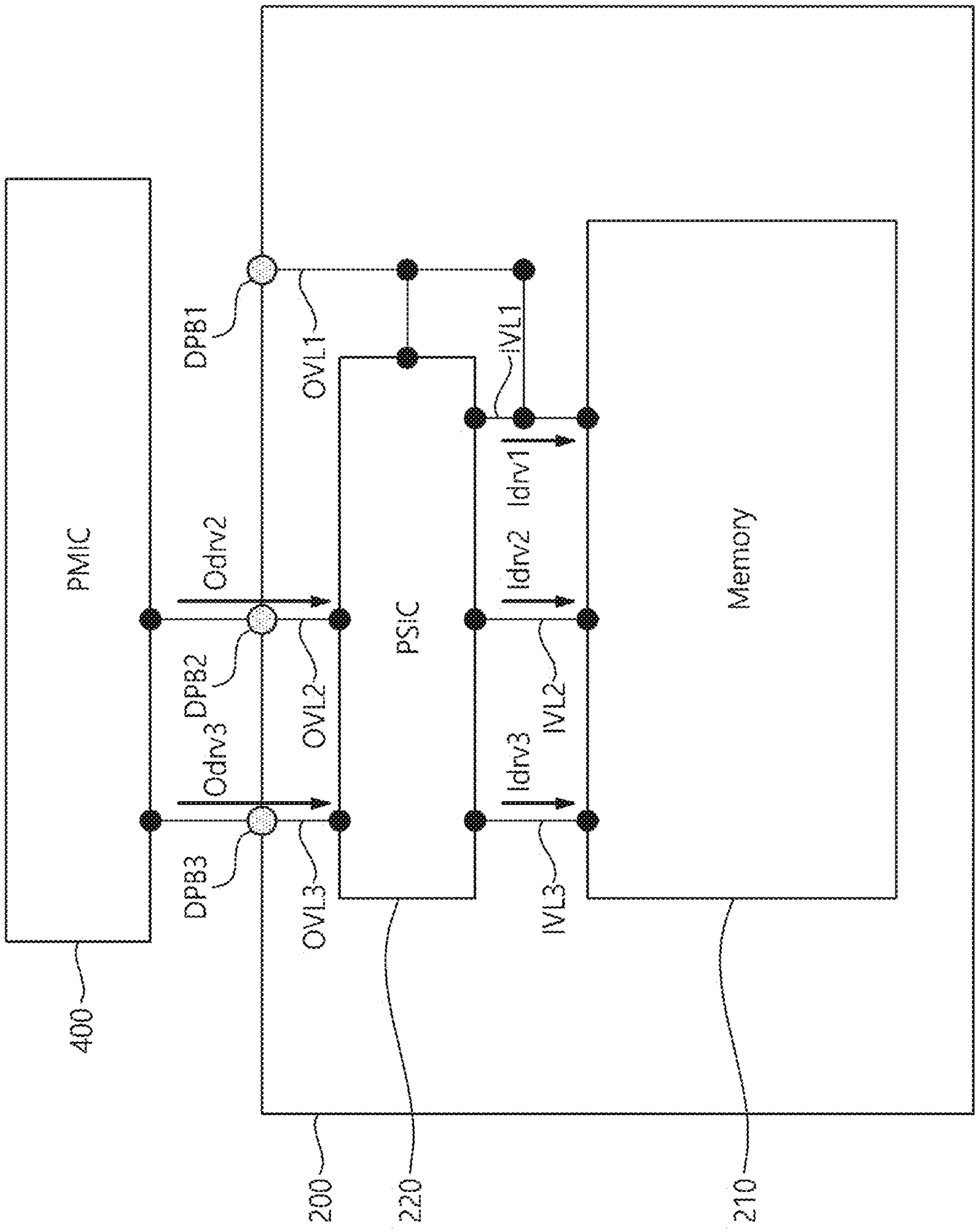

FIGS. 3 and 4 are diagrams for describing operation methods of the semiconductor package 200 illustrated in FIG. 2, according to an embodiment of the present disclosure.

Referring to FIG. 3, the semiconductor package 200 may be supplied with one or more external driving voltages from the power management circuit 400 which is located outside the semiconductor package 200.

For example, the semiconductor package 200 may include the first driving voltage package ball DPB1, the second driving voltage package ball DPB2 and the third driving voltage package ball DPB3. Each of the first driving voltage package ball DPB1, the second driving voltage package ball DPB2 and the third driving voltage package ball DPB3 may be electrically connected to the power management circuit 400.

The semiconductor package 200 may be supplied with a first external driving voltage Odrv1 through the first driving voltage package ball DPB1. The semiconductor package 200 may be supplied with a second external driving voltage Odrv2 and a third external driving voltage Odrv3 through the second driving voltage package ball DPB2 and the third driving voltage package ball DPB3, respectively.

For example, the first external driving voltage Odrv1 may be a voltage higher than the second external driving voltage Odrv2 and the third external driving voltage Odrv3, but is not limited thereto.

Each of the first external driving voltage Odrv1, the second external driving voltage Odrv2 and the third external driving voltage Odrv3 may be supplied to the power supply circuit 220 included in the semiconductor package 200.

The power supply circuit 220 may output at least one internal driving voltage based on the first external driving voltage Odrv1, the second external driving voltage Odrv2 and the third external driving voltage Odrv3. The internal driving voltage may be various voltages which are used for the operation of the memory 210. The internal driving voltage may be used to drive a driving line such as a word line included in the memory 210 or generate a control signal to be transmitted and received in the memory 210, but is not limited thereto.

For example, the power supply circuit 220 may output an internal driving voltage of the same level as the level of an external driving voltage. For another example, the power supply circuit 220 may output an internal driving voltage obtained by regulating the level of an external driving voltage.

The power supply circuit 220 may determine whether to output an internal driving voltage, based on an external driving voltage.

For example, the first external voltage interconnection OVL1 which is electrically connected between the first driving voltage package ball DPB1 and the power supply circuit 220 may be electrically connected to the memory 210. The first external voltage interconnection OVL1 may be electrically connected to the first internal voltage interconnection IVL1 which is electrically connected between the power supply circuit 220 and the memory 210. As the case may be, the first external voltage interconnection OVL1 may be physically separated from the first internal voltage interconnection IVL1 and be electrically connected to the memory 210.

The power supply circuit 220 may determine whether to output an internal driving voltage to the first internal voltage interconnection IVL1, based on whether the first external driving voltage Odrv1 is received.

For example, the power supply circuit 220 may generate an internal driving voltage to be supplied through the first internal voltage interconnection IVL1.

The power supply circuit 220 may compare the level of the generated internal driving voltage with the voltage level of the first driving voltage package ball DPB1. The power supply circuit 220 may check whether the first external driving voltage Odrv1 is received, through comparison of the level of the generated internal driving voltage and the voltage level of the first driving voltage package ball DPB1.

The power supply circuit 220 might not output the generated internal driving voltage when the voltage level of the first driving voltage package ball DPB1 or the level of the first external driving voltage Odrv1 is equal to or higher than the level of the generated internal driving voltage. The power supply circuit 220 may set the first internal voltage interconnection IVL1 to a high impedance state.

For another example, the power supply circuit 220 may check whether the voltage level of the first driving voltage package ball DPB1 is equal to or higher than a preset reference level. When the voltage level of the first driving voltage package ball DPB1 is equal to or higher than the reference level, the power supply circuit 220 might not generate or output an internal driving voltage to be supplied to the first internal voltage interconnection IVL1. The power supply circuit 220 may set the first internal voltage interconnection IVL1 to a high impedance state.

As the case may be, when the voltage level of the first driving voltage package ball DPB1 is equal to or higher than the level of the generated internal driving voltage and is equal to or higher than the preset reference level, the power supply circuit 220 may set the first internal voltage interconnection IVL1 to a high impedance state. The power supply circuit 220 might not output the generated internal driving voltage to the first internal voltage interconnection IVL1.

The power supply circuit 220 may output a second internal driving voltage Idrv2 based on the second external driving voltage Odrv2 to the memory 210. The power supply circuit 220 may output a third internal driving voltage Idrv3 based on the third external driving voltage Odrv3 to the memory 210. In the state in which the first internal voltage interconnection IVL1 is set to a high impedance, the second internal driving voltage Idrv2 may be supplied through the second internal voltage interconnection IVL2. In the state in which the first internal voltage interconnection IVL1 is set to a high impedance, the third internal driving voltage Idrv3 may be supplied through the third internal voltage interconnection IVL3.

The power supply circuit 220 might not output the internal driving voltage to the first internal voltage interconnection IVL1. The first external driving voltage Odrv1 may be supplied to the memory 210 through the first external voltage interconnection OVL1. During a period in which the first internal voltage interconnection IVL1 is set to a high impedance state, the first external driving voltage Odrv1 may be supplied to the first external voltage interconnection OVL1.

In the structure in which the first external voltage interconnection OVL1 electrically connected to the first driving voltage package ball DPB1 is electrically connected to the power supply circuit 220 and the memory 210, a driving voltage to be supplied to the memory 210 may be controlled according to voltage comparison by the power supply circuit 220.

As the case may be, a part of external driving voltages might not be supplied from the power management circuit 400. In this case, a voltage for driving the memory 210 may be supplied by the power supply circuit 220.

For example, referring to FIG. 4, the semiconductor package 200 may include the first driving voltage package ball DPB1, the second driving voltage package ball DPB2 and the third driving voltage package ball DPB3.

The first driving voltage package ball DPB1 may be electrically separated from the power management circuit 400. Each of the second driving voltage package ball DPB2 and the third driving voltage package ball DPB3 may be electrically connected to the power management circuit 400. In this case, the first driving voltage package ball DPB1 may be referred to as a dummy package ball.

By using the second external driving voltage Odrv2 and the third external driving voltage Odrv3 supplied through the second driving voltage package ball DPB2 and the third driving voltage package ball DPB3, the power supply circuit 220 may output the second internal driving voltage Idrv2 and the third internal driving voltage Idrv3.

The power supply circuit 220 may generate a first internal driving voltage Idrv1 using at least one of the second external driving voltage Odrv2 and the third external driving voltage Odrv3.

The power supply circuit 220 may compare the level of the first internal driving voltage Idrv1 with the voltage level of the first driving voltage package ball DPB1. When the voltage level of the first driving voltage package ball DPB1 is lower than the level of the first internal driving voltage Idrv1, the power supply circuit 220 may output the first internal driving voltage Idrv1 to the first internal voltage interconnection IVL1.

Alternatively, the power supply circuit 220 may compare the voltage level of the first driving voltage package ball DPB1 with a preset reference level. When the voltage level of the first driving voltage package ball DPB1 is lower than the reference level, the power supply circuit 220 may output the first internal driving voltage Idrv1 to the first internal voltage interconnection IVL1.

As such, in the structure in which the semiconductor package 200 includes the first driving voltage package ball DPB1, based on the voltage level of the first driving voltage package ball DPB1 or the first external voltage interconnection OVL1, the power supply circuit 220 may control whether to supply the first internal driving voltage Idrv1.

Even in a case where an external driving voltage is selectively supplied by the power management circuit 400 which is located outside the semiconductor package 200, various voltages for driving the memory 210 may be supplied by the power supply circuit 220.

In addition, as the case may be, even in a structure in which the first driving voltage package ball DPB1 is electrically connected to the power management circuit 400, when the voltage level of the first driving voltage package ball DPB1 is lower than the level of the first internal driving voltage Idrv1 or the reference level, the first internal driving voltage Idrv1 may be outputted to the first internal voltage interconnection IVL1.

The power supply circuit 220 may include a configuration which generates internal driving voltage(s) and a configuration which controls whether to output the internal driving voltage(s).

Figure 5:
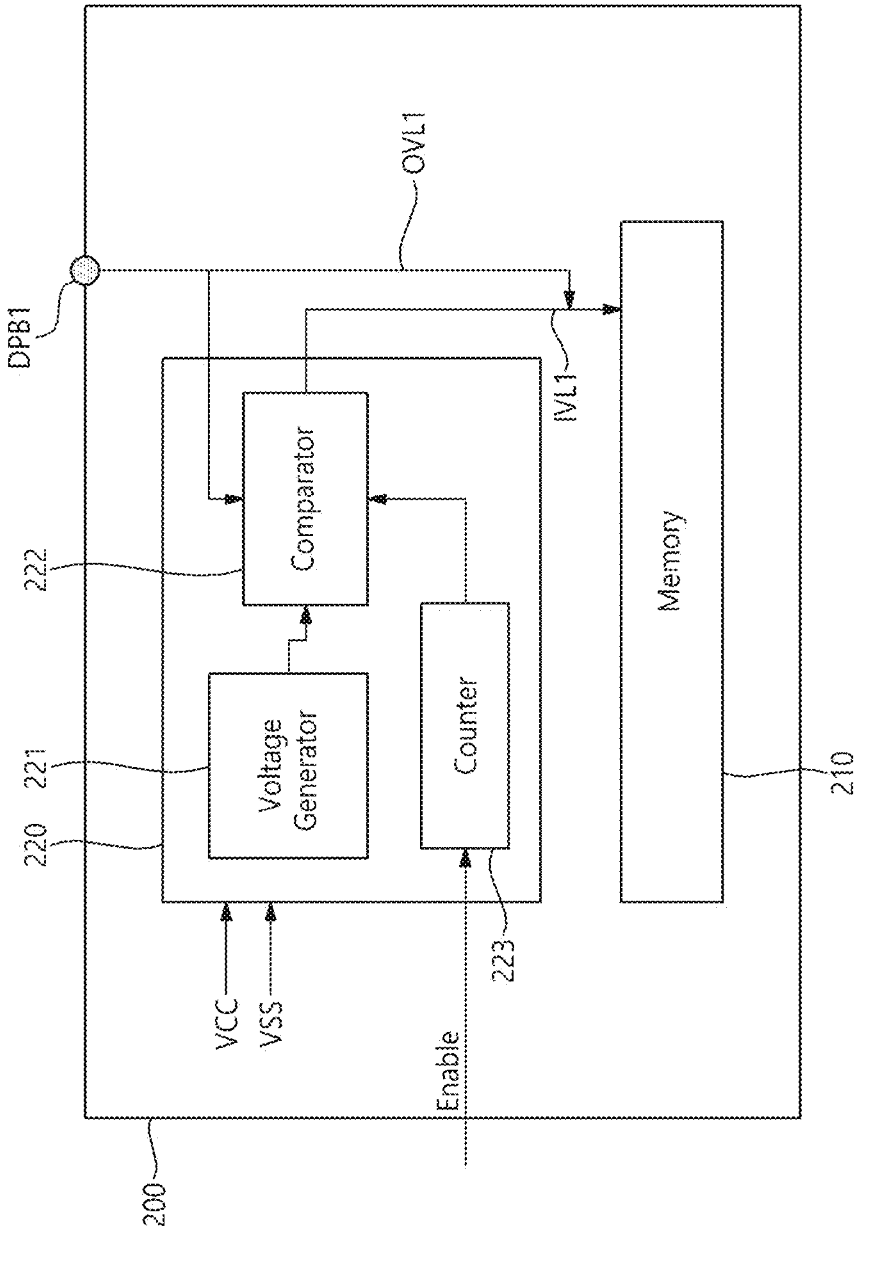
FIG. 5 is a diagram illustrating a configuration of a power supply circuit included in the semiconductor package illustrated in FIG. 2, according to an embodiment of the present disclosure.

FIG. 5 is a diagram illustrating a configuration of the power supply circuit 220 included in the semiconductor package 200 illustrated in FIG. 2, according to an embodiment of the present disclosure.

Referring to FIG. 5, the power supply circuit 220 may include a voltage generator 221, a comparator 222 and a counter 223.

The power supply circuit 220 may receive a high potential voltage VCC and a low potential voltage VSS for the operation thereof, from the outside. For example, the power supply circuit 220 may generate an internal driving voltage using at least one of the high potential voltage VCC, the low potential voltage VSS and an external driving voltage received from the outside.

The voltage generator 221 may be, for example, a charge pump or a boost converter.

The voltage generator 221 may generate an internal driving voltage using at least one of voltages received from the outside.

For example, the voltage generator 221 may generate the first internal driving voltage Idrv1 using at least one of the second external driving voltage Odrv2 and the third external driving voltage Odrv3 received from the power management circuit 400.

As the case may be, the voltage generator 221 may generate the second internal driving voltage Idrv2, the third internal driving voltage Idrv3, etc. using at least one of the second external driving voltage Odrv2 and the third external driving voltage Odrv3. For example, the voltage generator 221 may generate the first internal driving voltage Idrv1 by raising the level of the second external driving voltage Odrv2. The voltage generator 221 may generate the second internal driving voltage Idrv2 by lowering the level of the second external driving voltage Odrv2.

The first internal driving voltage Idrv1 generated by the voltage generator 221 may be inputted to the comparator 222.

The comparator 222 may be electrically connected to the first external voltage interconnection OVL1 which is electrically connected to the first driving voltage package ball DPB1. The comparator 222 may compare the voltage level of the first driving voltage package ball DPB1 and the voltage level of the first internal driving voltage Idrv1.

According to a voltage level comparison result, the comparator 222 may determine whether to output the first internal driving voltage Idrv1 to the first internal voltage interconnection IVL1.

In the present disclosure, the voltage generator 221 included in the power supply circuit 220 may be referred to as a voltage generation circuit, and a configuration including the comparator 222, which controls whether to output the first internal driving voltage Idrv1, may be referred to as a voltage output circuit.

The counter 223 may provide a counting value which is used to control the operation timing of the power supply circuit 220. The counter 223 may provide a counting value which controls the operation timing of at least one of the voltage generator 221 and the comparator 222.

For example, the counter 223 may start a counting operation when receiving a power-on signal from the outside. For another example, the counter 223 may start a counting operation when receiving an operation enable signal (Enable) from the outside. The power-on signal or the operation enable signal may be a signal which is received from the host device 500 or the controller 300.

The power supply circuit 220 includes a configuration which generates an internal driving voltage, a configuration which compares the levels of the internal driving voltage and an external driving voltage and a configuration which controls the timing of an operation, and may control whether to generate the internal driving voltage or whether to output the internal driving voltage.

Figure 6:
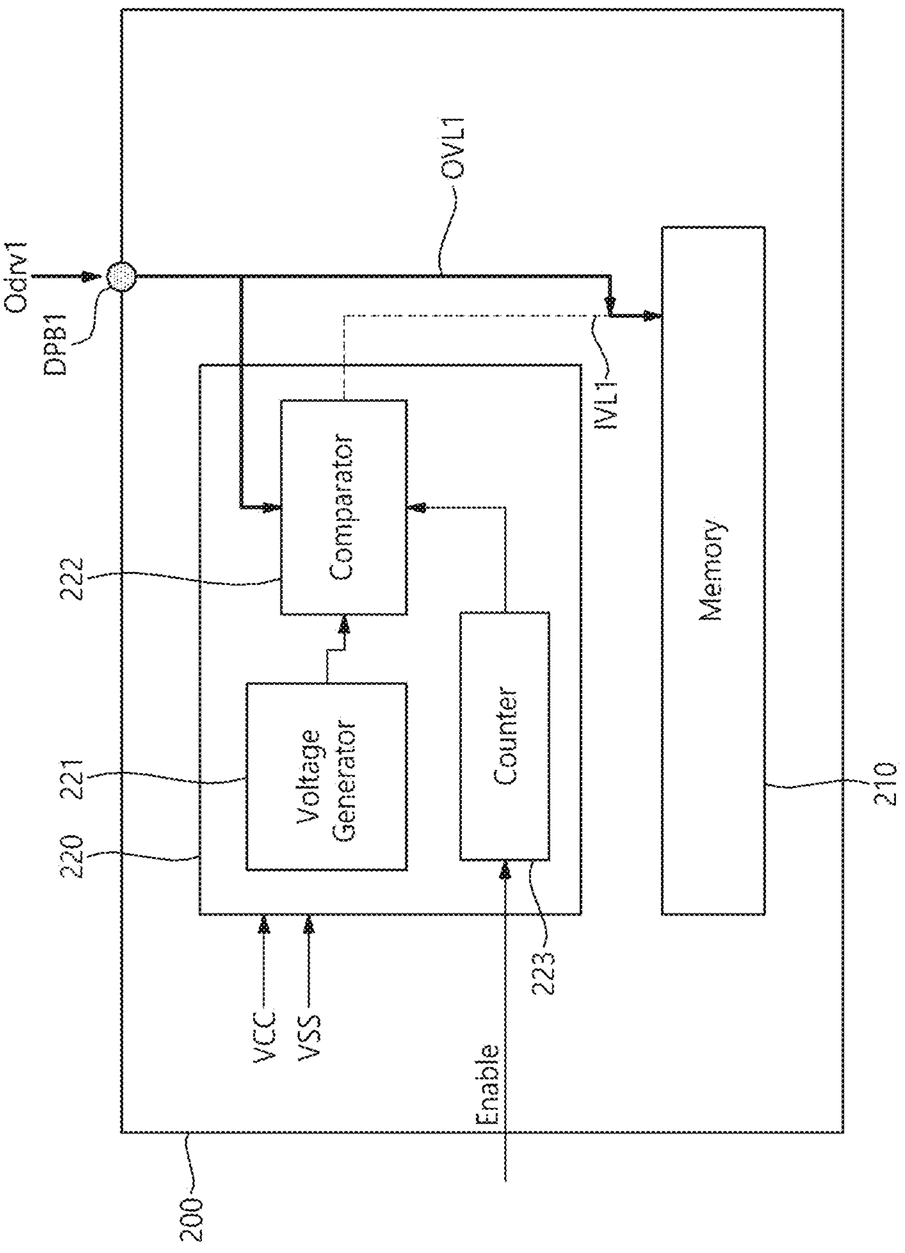
FIGS. 6 and 7 are diagrams for describing operation methods of the power supply circuit illustrated in FIG. 5, according to an embodiment of the present disclosure.
Figure 7:
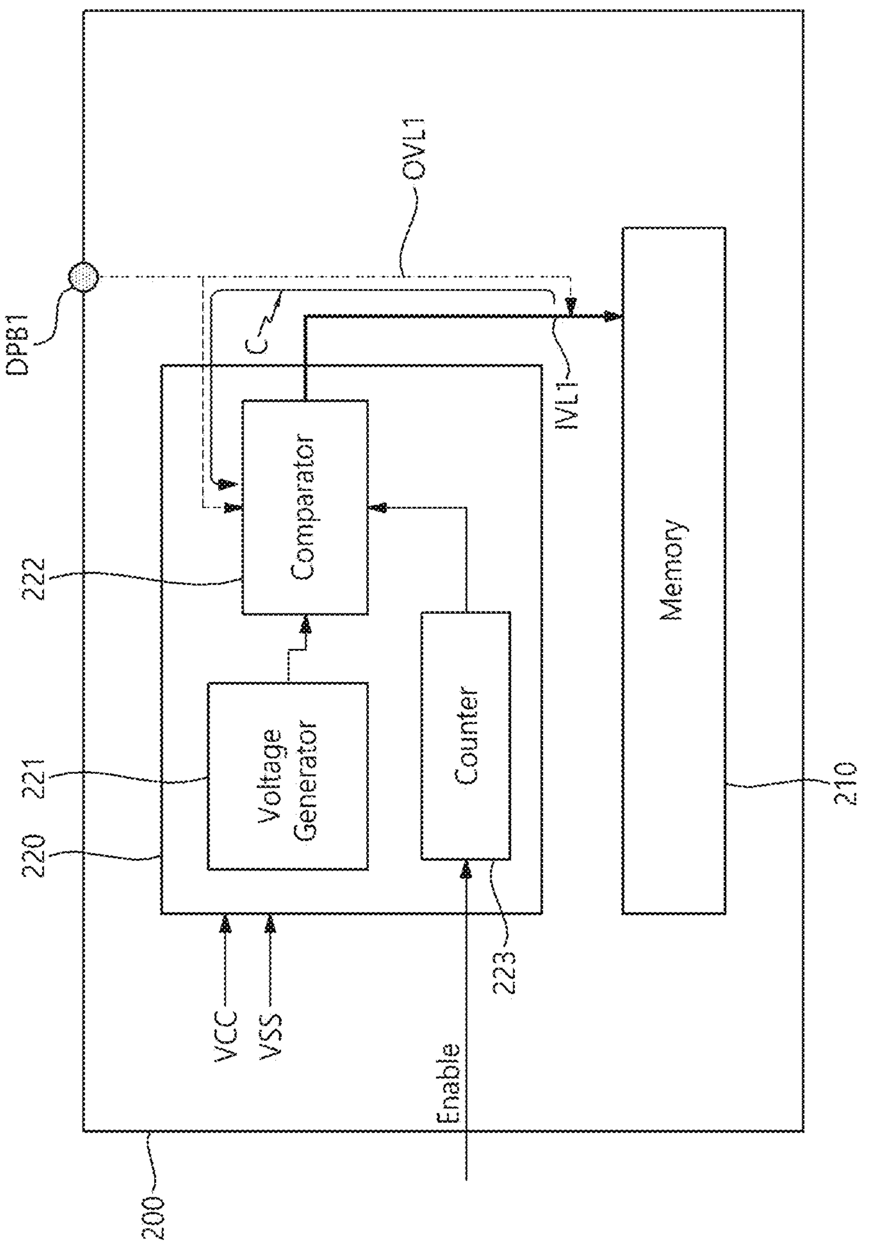

FIGS. 6 and 7 are diagrams for describing operation methods of the power supply circuit 220 illustrated in FIG. 5, according to an embodiment of the present disclosure.

Referring to FIG. 6, a case where the semiconductor package 200 receives the first external driving voltage Odrv1 from the power management circuit 400 is illustrated as an example.

The power supply circuit 220 may receive the first external driving voltage Odrv1 through the first driving voltage package ball DPB1 of the semiconductor package 200. The first external driving voltage Odrv1 may be inputted to the comparator 222 of the power supply circuit 220 through the first external voltage interconnection OVL1.

The voltage generator 221 of the power supply circuit 220 may generate and output the first internal driving voltage Idrv1.

The comparator 222 may compare the level of the first driving voltage package ball DPB1, the first external voltage interconnection OVL1 or the first external driving voltage Odrv1 with the level of the first internal driving voltage Idrv1. When the voltage level of the first driving voltage package ball DPB1 is equal to or higher than the level of the first internal driving voltage Idrv1, the comparator 222 might not output the first internal driving voltage Idrv1 to the first internal voltage interconnection IVL1. The power supply circuit 220 may set the first internal voltage interconnection IVL1 to a high impedance state.

As the case may be, the comparator 222 may compare the voltage level of the first driving voltage package ball DPB1 with a preset reference level. When the voltage level of the first driving voltage package ball DPB1 is equal to or higher than the reference level, the voltage generator 221 of the power supply circuit 220 might not generate the first internal driving voltage Idrv1. Alternatively, the voltage generator 221 may generate the first internal driving voltage Idrv1, and the first internal driving voltage Idrv1 might not be outputted to the first internal voltage interconnection IVL1 by the comparator 222.

According to reception of the first external driving voltage Odrv1, whether to supply the first internal driving voltage Idrv1 may be controlled.

For another example, referring to FIG. 7, a case where the semiconductor package 200 does not receive the first external driving voltage Odrv1 from the power management circuit 400 is illustrated as an example.

The first driving voltage package ball DPB1 of the semiconductor package 200 may be electrically separated from the power management circuit 400.

The voltage generator 221 of the power supply circuit 220 may generate the first internal driving voltage Idrv1. The comparator 222 may compare the voltage level of the first driving voltage package ball DPB1 with the level of the first internal driving voltage Idrv1. When the voltage level of the first driving voltage package ball DPB1 is lower than the level of the first internal driving voltage Idrv1, the comparator 222 may output the first internal driving voltage Idrv1 to the first internal voltage interconnection IVL1.

As the case may be, the comparator 222 may compare the voltage level of the first driving voltage package ball DPB1 with a preset reference level. When the voltage level of the first driving voltage package ball DPB1 is lower than the reference level, the comparator 222 may output the first internal driving voltage Idrv1 to the first internal voltage interconnection IVL1.

Even in a case where the first driving voltage package ball DPB1 is electrically connected to the power management circuit 400, when the voltage level of the first driving voltage package ball DPB1 is lower than the first internal driving voltage Idrv1 or the reference level, the first internal driving voltage Idrv1 may be outputted to the first internal voltage interconnection IVL1.

The first internal driving voltage Idrv1 outputted through the first internal voltage interconnection IVL1 may be supplied to the memory 210.

Since the first internal voltage interconnection IVL1 is electrically connected to the first external voltage interconnection OVL1, the first internal driving voltage Idrv1 supplied through the first internal voltage interconnection IVL1 may be fed back to the power supply circuit 220 through the first external voltage interconnection OVL1 as indicated by 'C'. The first internal driving voltage Idrv1 fed back to the power supply circuit 220 may be inputted to the comparator 222.

The level of the first internal driving voltage Idrv1 fed back to the comparator 222 may be lower than the level of the first internal driving voltage Idrv1 outputted to the first internal voltage interconnection IVL1 due to the load of a feedback path.

Even through the comparator 222 receives the first internal driving voltage Idrv1 fed back through the first external voltage interconnection OVL1 after outputting the first internal driving voltage Idrv1, the comparator 222 may maintain the output of the first internal driving voltage Idrv1 to the first internal voltage interconnection IVL1 according to a voltage comparison result.

In the structure in which the first external voltage interconnection OVL1 and the first internal voltage interconnection IVL1 are disposed by being electrically connected to each other, the first internal driving voltage Idrv1 may be stably supplied to the memory 210.

Since the power supply circuit 220 controls whether to output the first internal driving voltage Idrv1, according to a voltage comparison result by the comparator 222, a certain time may be required before the first internal driving voltage Idrv1 is outputted.

Figure 8:
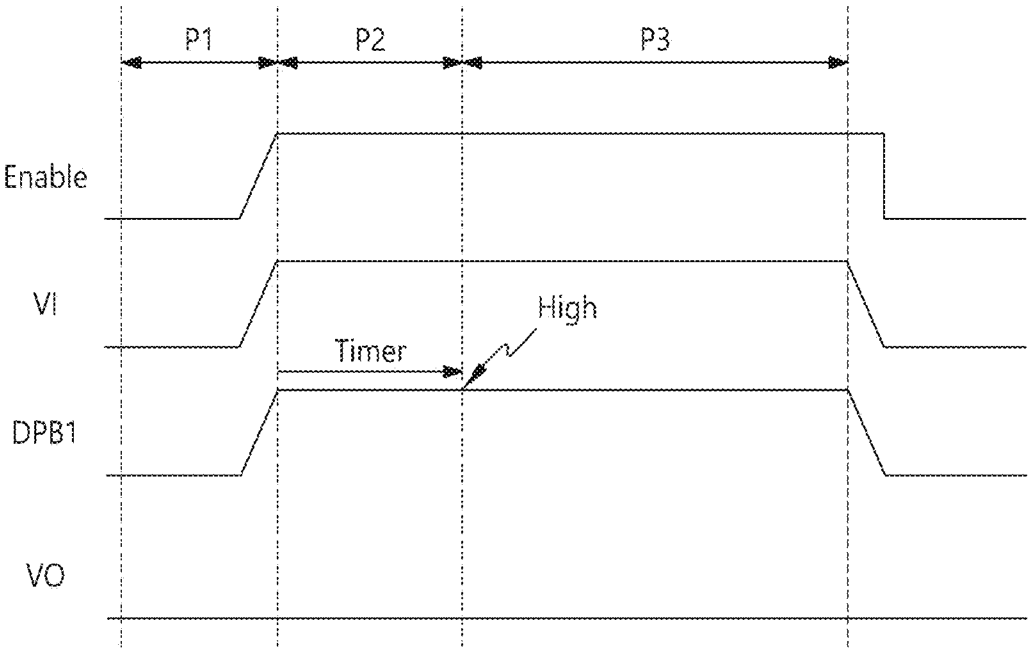
FIGS. 8 to 10 are timing diagrams for describing operations of the power supply circuit illustrated in FIG. 5, according to an embodiment of the present disclosure.
Figure 9:
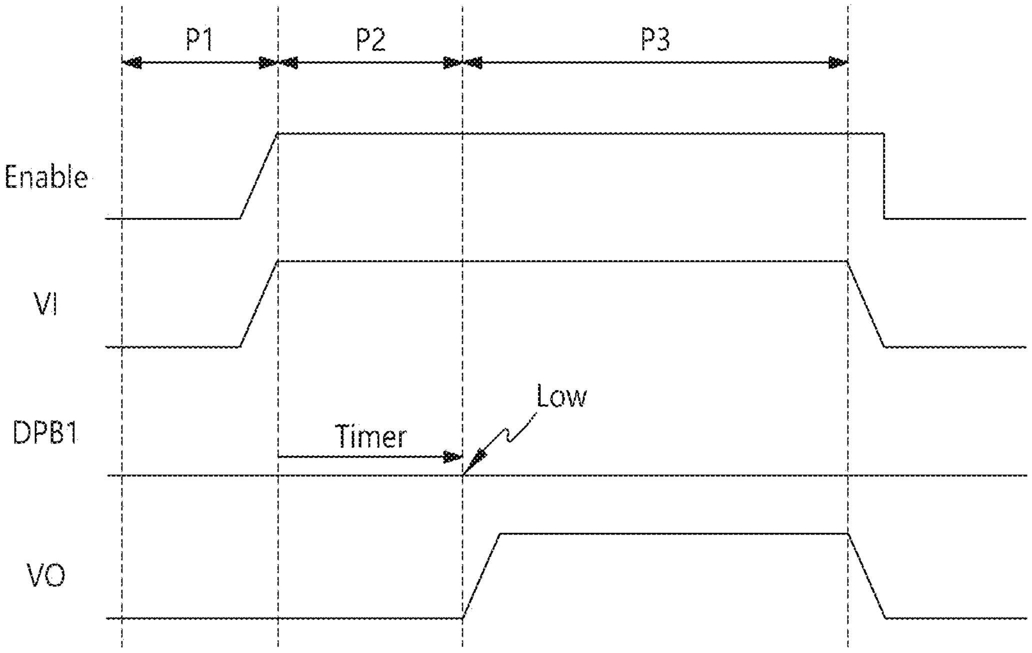
Figure 10:
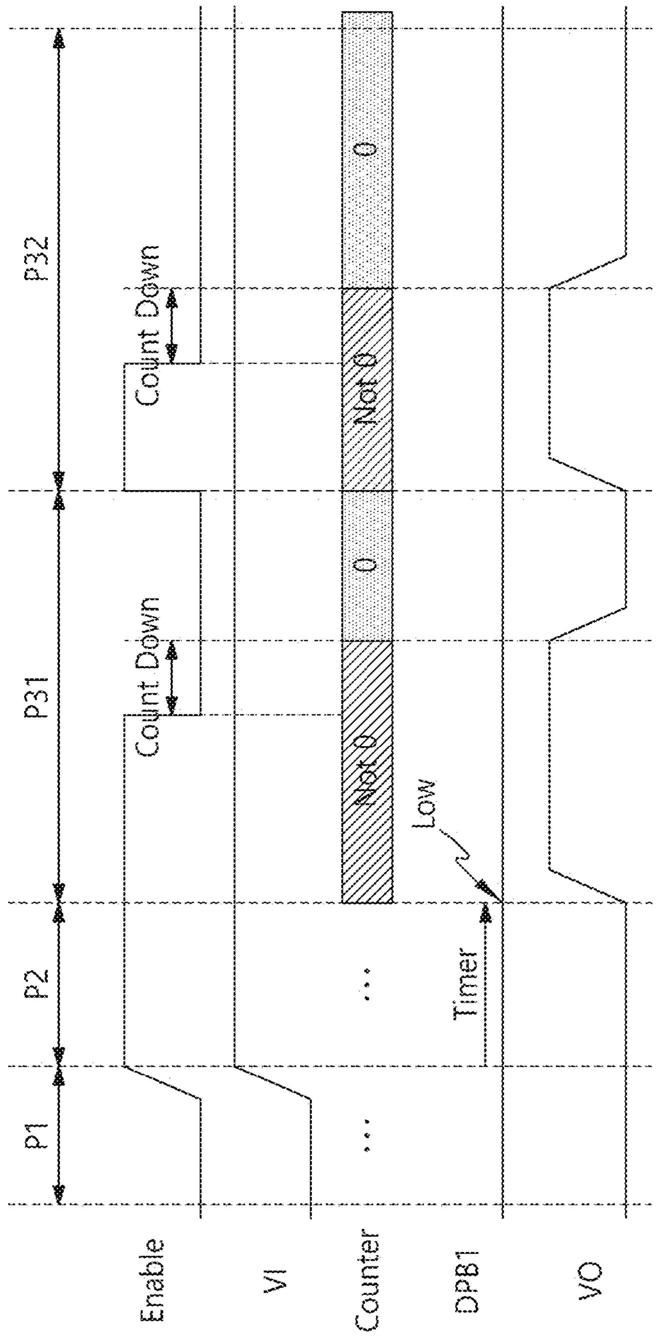

FIGS. 8 to 10 are timing diagrams for describing operation of the power supply circuit 220 illustrated in FIG. 5, according to an embodiment of the present disclosure.

FIGS. 8 and 9 illustrate examples of operation timings of the semiconductor package 200 included in the storage device 100 after the storage device 100 is booted. FIG. 8 illustrates an example of a case where the semiconductor package 200 receives the first external driving voltage Odrv1 from the outside. FIG. 9 illustrates an example of a case where the semiconductor package 200 does not receive the first external driving voltage Odrv1 from the outside.

Referring to FIG. 8, during a first period P1, the operations of the memory 210 and the power supply circuit 220 included in the semiconductor package 200 may be started according to the operation enable signal (Enable). Alternatively, of the semiconductor package 200 may be started by the power-on signal. 'VI' may represent the level of the first internal driving voltage Idrv1 provided by the power supply circuit 220. 'DPB1' may represent the voltage level of the first driving voltage package ball DPB1. 'VO' may represent the level of a voltage outputted to the first internal voltage interconnection IVL1 by the power supply circuit 220.

During the first period P1, an internal driving voltage may be generated according to the operation enable signal, and comparison with the first driving voltage package ball DBP1 may be performed.

The power supply circuit 220 may compare the voltage level of the first driving voltage package ball DPB1 with the level of the first internal driving voltage Idrv1 or the reference level during a predetermined period by using the counter 223. For example, during a second period P2, the power supply circuit 220 may compare the voltage level of the first driving voltage package ball DPB1 with the level of the first internal driving voltage Idrv1.

During the second period P2 in which voltage comparison is performed, the power supply circuit 220 may set the first internal voltage interconnection IVL1 to a high impedance state.

When the voltage level of the first driving voltage package ball DPB1 is equal to or higher than the level of the first internal driving voltage Idrv1 according to a result of the voltage comparison performed during the second period P2, the power supply circuit 220 might not output the first internal driving voltage Idrv1 to the first internal voltage interconnection IVL1 during a third period P3. During the third period P3, 'VO' may maintain a low level, and the high impedance state of the first internal voltage interconnection IVL1 may be maintained.

For another example, referring to FIG. 9, during a first period P1, the operation of the semiconductor package 200 may be started according to the operation enable signal. During a second period P2, the power supply circuit 220 may compare the voltage level of the first driving voltage package ball DPB1 with the level of the first internal driving voltage Idrv1.

During the second period P2 in which the voltage comparison is performed, the power supply circuit 220 may set the first internal voltage interconnection IVL1 to a high impedance state.

When the voltage level of the first driving voltage package ball DPB1 is lower than the level of the first internal driving voltage Idrv1 according to a result of the voltage comparison during the second period P2, the power supply circuit 220 may output the first internal driving voltage Idrv1 to the first internal voltage interconnection IVL1 during a third period P3. The high impedance state of the first internal voltage interconnection IVL1 may be released during the third period P3, and the level of 'VO' may be a high level during the third period P3.

In this way, when the operation of the storage device 100 is started, the power supply circuit 220 may control a voltage to be supplied to the memory 210, through comparison of the voltage level of the first driving voltage package ball DPB1 and the level of the first internal driving voltage Idrv1.

When generating the first internal driving voltage Idrv1 and supplying the first internal driving voltage Idrv1 to the memory 210, the power supply circuit 220 may reduce power consumption by adjusting the output of the first internal driving voltage Idrv1 according to the operation state of the memory 210.

Referring to FIG. 10, during a first period P1, the operation of the storage device 100 may be started according to the operation enable signal. The power supply circuit 220 may start generation of the first internal driving voltage Idrv1.

During a second period P2, the first internal voltage interconnection IVL1 may be set to a high impedance state. During the second period P2, the voltage level of the first driving voltage package ball DPB1 and the level of the first internal driving voltage Idrv1 may be compared.

When the voltage level of the first driving voltage package ball DPB1 is lower than the level of the first internal driving voltage Idrv1, during a third period P31 and P32, the first internal driving voltage Idrv1 may be outputted to the first internal voltage interconnection IVL1. The level of 'VO' may change from a low level to a high level.

During the third period P31 and P32, a counting value of the counter 223 may be set to a reference value. The reference value may be a value greater than 0, but as the case may be, the reference value may be set to 0. During the third period P31 and P32, while the operation enable signal maintains a high level, a counting value of the counter 223 may maintain the reference value.

During a first partial period P31 of the third period P31 and P32, the level of the operation enable signal may change from a first level to a second level. For example, the level of the operation enable signal may change from a high level to a low level.

When the level of the operation enable signal changes from a high level to a low level, the counter 223 may start a counting operation. For example, depending on a reference value, the counter 223 may start counting in such a way to decrease a counting value, or may start counting in such a way to increase a counting value. The counter 223 may perform counting until a counting value reaches a preset target value.

For example, during the first partial period P31, the reference value set as a counting value of the counter 223 is a value greater than 0, and the counter 223 may perform counting in such a way to decrease the counting value when the level of the operation enable signal changes. The target value may be, for example, 0, and the counter 223 may perform counting until the target value is reached.

When a counting value of the counter 223 reaches the target value, the power supply circuit 220 may stop generating or outputting the first internal driving voltage Idrv1 during the first partial period P31. A time corresponding to the difference between the reference value and the target value by the counter 223 may be set to be equal to or longer than the time of an operation that requires a longest time among operations of the memory 210. For example, the reference value or the target value may be set to correspond to a time required to erase data written to the memory 210 or a time obtained as a delay time is added to the corresponding time.

When a counting value of the counter 223 reaches the target value, because the generation or output of the first internal driving voltage Idrv1 is stopped during the remaining period of the first partial period P31, power consumption according to the supply of the first internal driving voltage Idrv1 may be reduced.

When the level of the operation enable signal changes from the second level to the first level, the power supply circuit 220 may output the first internal driving voltage Idrv1 again. For example, during a second partial period P32 of the third period P31 and P32, the operation enable signal may change from a low level to a high level.

The first internal driving voltage Idrv1 may be outputted, and a counting value of the counter 223 may be set again to the reference value.

When the level of the operation enable signal changes from a high level to a low level during the second partial period P32, a counting operation of the counter 223 may be started. When a counting value of the counter 223 reaches the target value, the power supply circuit 220 may stop generating or outputting the first internal driving voltage Idrv1.

As such, the embodiment of the present disclosure may easily provide a voltage for driving the memory 210 in a case where an external driving voltage is supplied by the power supply circuit 220 included in the semiconductor package 200 and in a case where an external driving voltage is not supplied by the power supply circuit 220 included in the semiconductor package 200. In addition, since the supply time of an internal driving voltage is adjusted using the counter 223 included or separately added for the operation of the power supply circuit 220, power consumption according to driving of the power supply circuit 220 may be reduced.

Since the semiconductor package 200 based on the embodiment of the present disclosure has the structure which may operate both in the case where an external driving voltage is supplied and in the case where an external driving voltage is not supplied, the semiconductor package 200 may have a structure which includes a driving voltage package ball for receiving the corresponding external driving voltage regardless of whether the external driving voltage is supplied.

Figure 11:
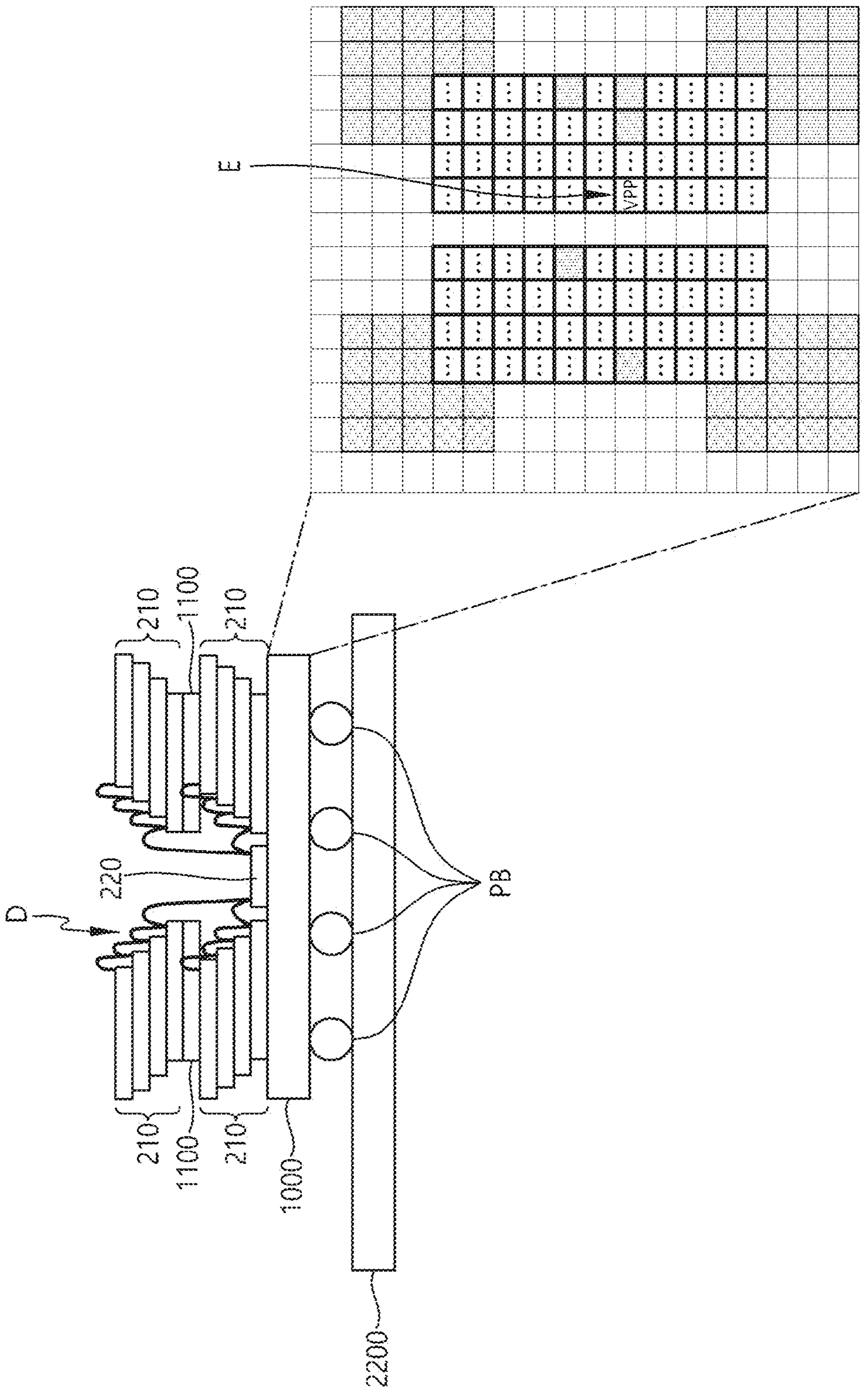
FIG. 11 is a diagram illustrating a structure of a semiconductor package according to an embodiment of the present disclosure.

FIG. 11 is a diagram illustrating a structure of a semiconductor package according to an embodiment of the present disclosure.

Referring to FIG. 11, an example of a structure in which the semiconductor package (e.g., 200) is disposed on a printed circuit board (PCB) 2200 is illustrated. The semiconductor package may be disposed on the printed circuit board 2200, and, although not illustrated in FIG. 11, a controller 300 may be additionally disposed. As the case may be, a power management circuit 400 may be disposed on the printed circuit board 2200.

The semiconductor package may include a package substrate 1000. At least one memory 210 may be disposed on the package substrate 1000. FIG. 11 illustrates as an example a case where 16 memories 210 are disposed by being stacked. An adhesive layer 1100 may be disposed between portions of the 16 memories 210 to prevent chip lifting during processing. The adhesive layer 1100 may be, for example, penetrated wafer backside lamination (PWBL) tape, but is not limited thereto.

A power supply circuit 220 may be disposed on the package substrate 1000 of the semiconductor package. A location where the power supply circuit 220 is disposed may be various.

The power supply circuit 220 may be electrically connected to the package substrate 1000. The power supply circuit 220 may be electrically connected to the memories 210 through wires as indicated by 'D'.

A plurality of package balls PB may be disposed on the backside of the package substrate 1000. At least a part of the plurality of package balls PB may be package balls PB for receiving a driving voltage. For example, as indicated by 'E', a package ball PB for receiving a voltage such as a boosted voltage VPP may be disposed. The boosted voltage VPP may correspond to a first external driving voltage Odrv1.

In the structure in which the memories 210 and the power supply circuit 220 are included in the semiconductor package included in a storage device (e.g., 100), a package ball PB is included in the package substrate 1000 of the semiconductor package, and voltage supply by the power supply circuit 220 may be controlled based on whether a voltage is received through the corresponding package ball PB. A voltage for operating the semiconductor package may be stably supplied in the case where a voltage is supplied through the corresponding package ball PB and in the case where a voltage is not supplied through the corresponding package ball PB.

The example of FIG. 11 illustrates a case in which only the memories 210 and the power supply circuit 220 are disposed in the semiconductor package, but as the case may be, the controller 300 may be additionally disposed in the semiconductor package.

Even in a case where the controller 300 is disposed in the semiconductor package 200, control of an internal driving voltage according to whether an external driving voltage is received or control for reducing power consumption according to generation of the internal driving voltage may be performed.

Figure 12:
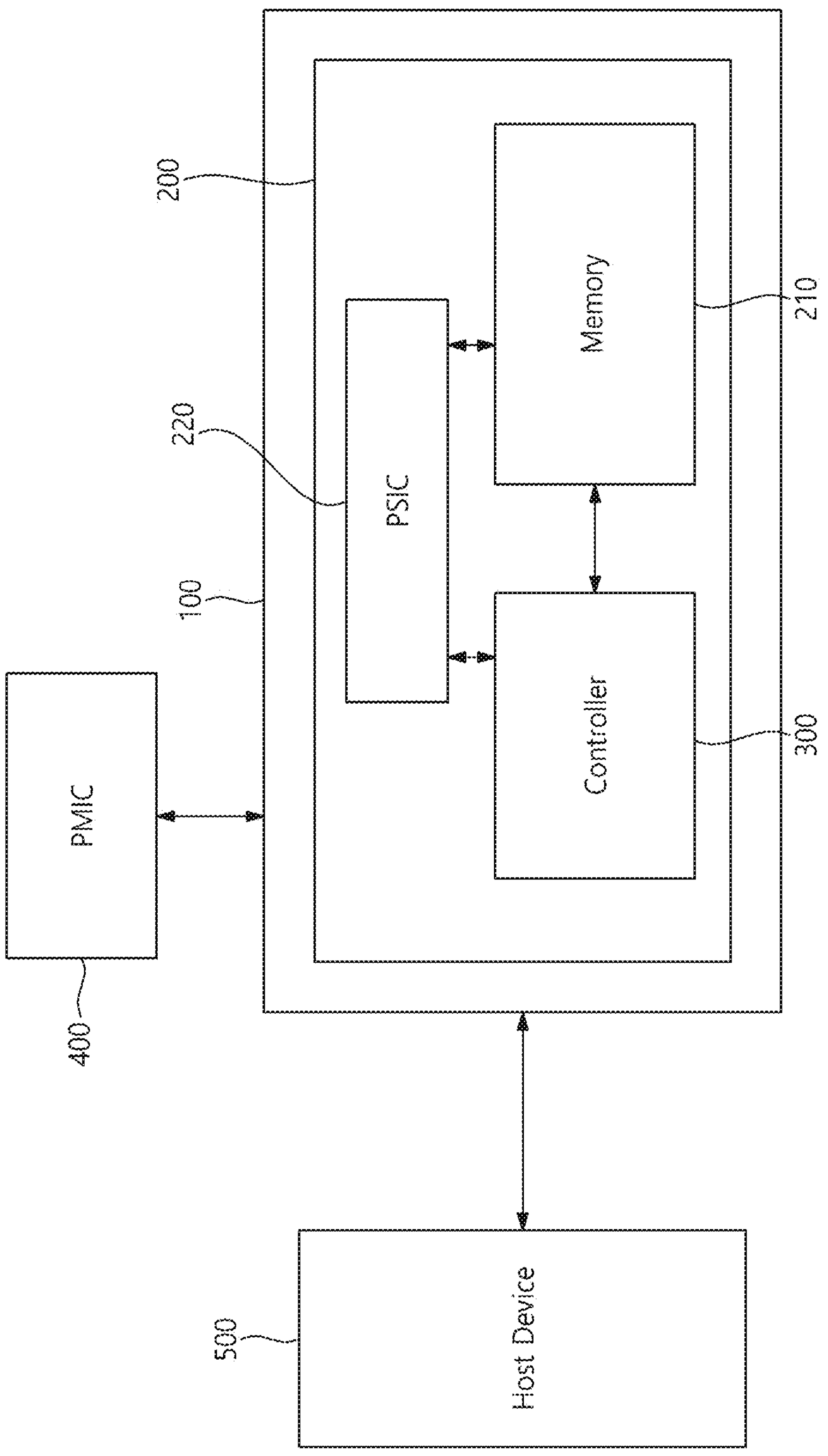
FIG. 12 is a diagram illustrating a configuration of a storage device according to an embodiment of the present disclosure.

FIG. 12 is a diagram illustrating a configuration of a storage device 100 according to an embodiment of the present disclosure.

Referring to FIG. 12, the storage device 100 may include a memory 210, a power supply circuit (PSIC) 220 and a controller 300.

The memory 210, the power supply circuit 220 and the controller 300 may be provided as a semiconductor package 200. The memory 210, the power supply circuit 220 and the controller 300 may be disposed on a substrate for packaging.

The storage device 100 may be supplied with at least one voltage from a power management circuit (PMIC) 400 which is located outside. The power management circuit 400 may be located in a host device 500 or, as the case may be, located on a printed circuit board on which the storage device 100 is mounted.

The power supply circuit 220 included in the semiconductor package 200 may supply a voltage for driving the memory 210 and the controller 300. In a structure in which the memory 210 and the controller 300 are disposed in the semiconductor package 200, the power supply circuit 220 may be disposed in the semiconductor package 200, and may supply at least one internal driving voltage.

The power supply circuit 220 may receive at least one voltage from the power management circuit 400, and may provide the internal driving voltage using the received voltage. Even in the structure in which the controller 300 is additionally disposed in the semiconductor package 200, a structure in which driving voltage package balls are disposed as described above may be applied. For example, the semiconductor package 200 may include a first driving voltage package ball DPB1, and the power supply circuit 220 may control whether to generate and provide a first internal driving voltage Idrv1, based on the voltage level of the first driving voltage package ball DPB1.

Alternatively, the semiconductor package 200 may include a driving voltage package ball to which an external driving voltage is applied from the power management circuit 400. The power supply circuit 220 may receive some voltages through driving voltage package balls, and may supply voltages for driving the memory 210 and the controller 220, by using the some voltages.

As such, in the structure in which the power supply circuit 220 supplies an internal driving voltage using an external driving voltage, the power supply circuit 220 may operate in such a way to reduce power consumption according to the generation and output of the internal driving voltage.

Figure 13:
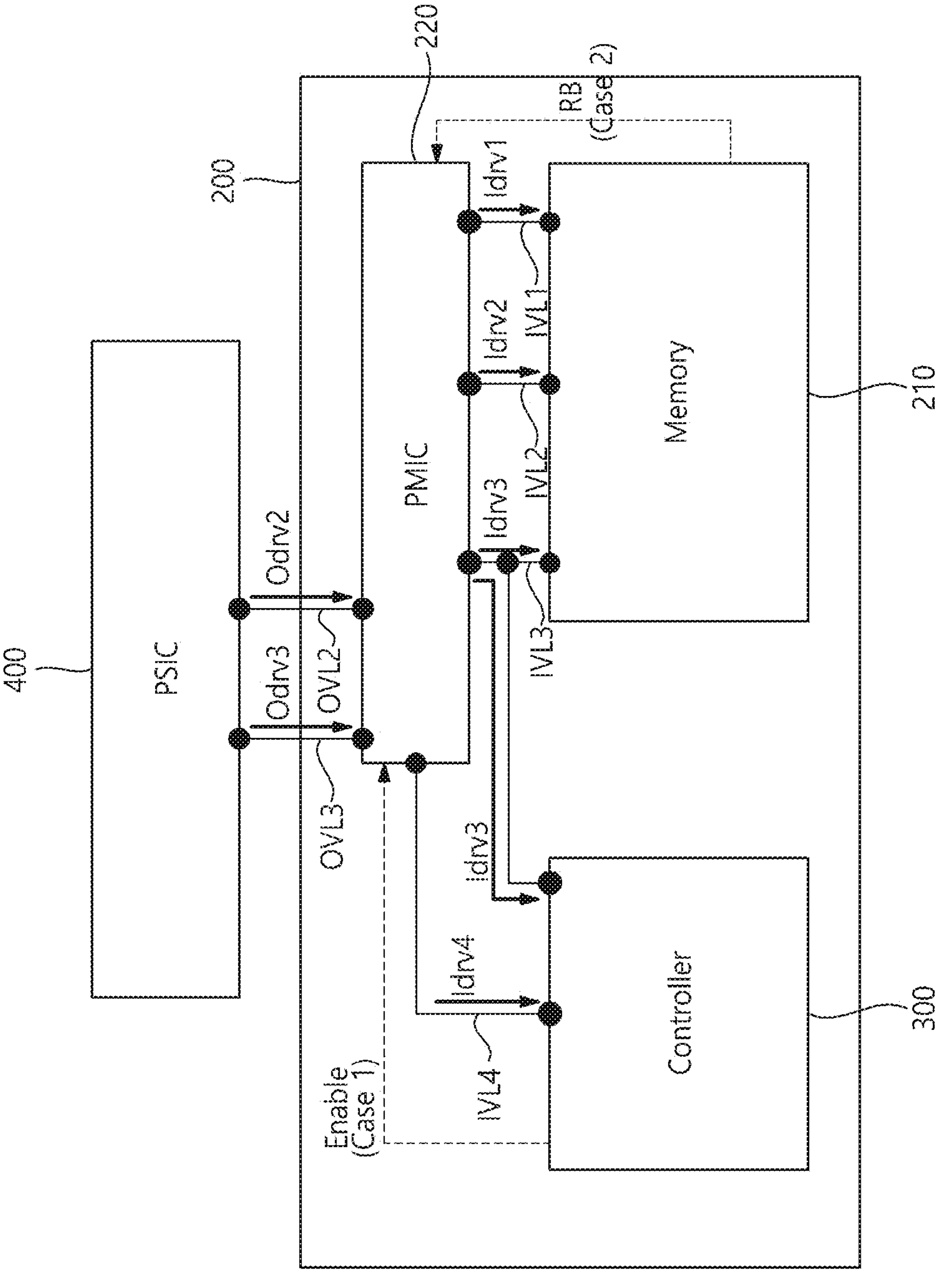
FIG. 13 is a diagram illustrating a configuration of a semiconductor package illustrated in FIG. 12, according to an embodiment of the present disclosure.

FIG. 13 is a diagram illustrating a configuration of the semiconductor package 200 illustrated in FIG. 12, according to an embodiment of the present disclosure.

Referring to FIG. 13, the memory 210, the controller 300 and the power supply circuit 220 may be disposed in the semiconductor package 200. The power supply circuit 220 may be supplied with some external driving voltages from the power management circuit 400 which is located outside the semiconductor package 200.

For example, the power supply circuit 220 may be supplied with a second external driving voltage Odrv2 and a third external driving voltage Odrv3 from the power management circuit 400. The power supply circuit 220 may output at least one internal driving voltage using the second external driving voltage Odrv2 and the third external driving voltage Odrv3.

The power supply circuit 220 may be electrically connected to the memory 210 through a first internal voltage interconnection IVL1, a second internal voltage interconnection IVL2 and a third internal voltage interconnection IVL3.

The power supply circuit 220 may supply a first internal driving voltage Idrv1, a second internal driving voltage Idrv2 and a third internal driving voltage Idrv3 to the memory 210 through the first internal voltage interconnection IVL1, the second internal voltage interconnection IVL2 and the third internal voltage interconnection IVL3, respectively.

For example, the first internal driving voltage Idrv1 may be a voltage higher than the second internal driving voltage Idrv2 and the third internal driving voltage Idrv3.

The power supply circuit 220 may generate the first internal driving voltage Idrv1 by raising the level of the second external driving voltage Odrv2 or the third external driving voltage Odrv3. The power supply circuit 220 may generate the second internal driving voltage Idrv2 or the third internal driving voltage Idrv3 by lowering the level of the second external driving voltage Odrv2 or the third external driving voltage Odrv3.

The power supply circuit 220 may supply an internal driving voltage for driving the controller 300. The power supply circuit 220 may be electrically connected to the controller 300 through the third internal voltage interconnection IVL3 and a fourth internal voltage interconnection IVL4. The power supply circuit 220 may supply the third internal driving voltage Idrv3 and a fourth internal driving voltage Idrv4 to the controller 300 through the third internal voltage interconnection IVL3 and the fourth internal voltage interconnection IVL4, respectively.

The power supply circuit 220 may adjust or stop supplying an internal driving voltage depending on the operation state of the memory 210.

For example (i.e., Case 1), the power supply circuit 220 may adjust an internal driving voltage to be supplied to the memory 210 or the controller 300, based on an operation enable signal (Enable) which is received from the controller 300. For another example (i.e., Case 2), the power supply circuit 220 may adjust an internal driving voltage to be supplied to the memory 210 or the controller 300, based on an operation ready signal (RB) which is received from the memory 210.

The operation enable signal or the operation ready signal may be a signal which indicates the start of the operation of the memory 210, the operation state of the memory 210 may be checked based on a change in the corresponding signal, and an internal driving voltage to be outputted by the power supply circuit 220 may be adjusted according to the operation state of the memory 210.

The internal driving voltage whose output is adjusted by the power supply circuit 220 may be various, and for example, the output of the first internal driving voltage Idrv1 which has a highest level may be controlled.

For example, the power supply circuit 220 may adjust the output of the first internal driving voltage Idrv1 using a counter which operates based on the operation enable signal or the operation ready signal.

Figure 14:
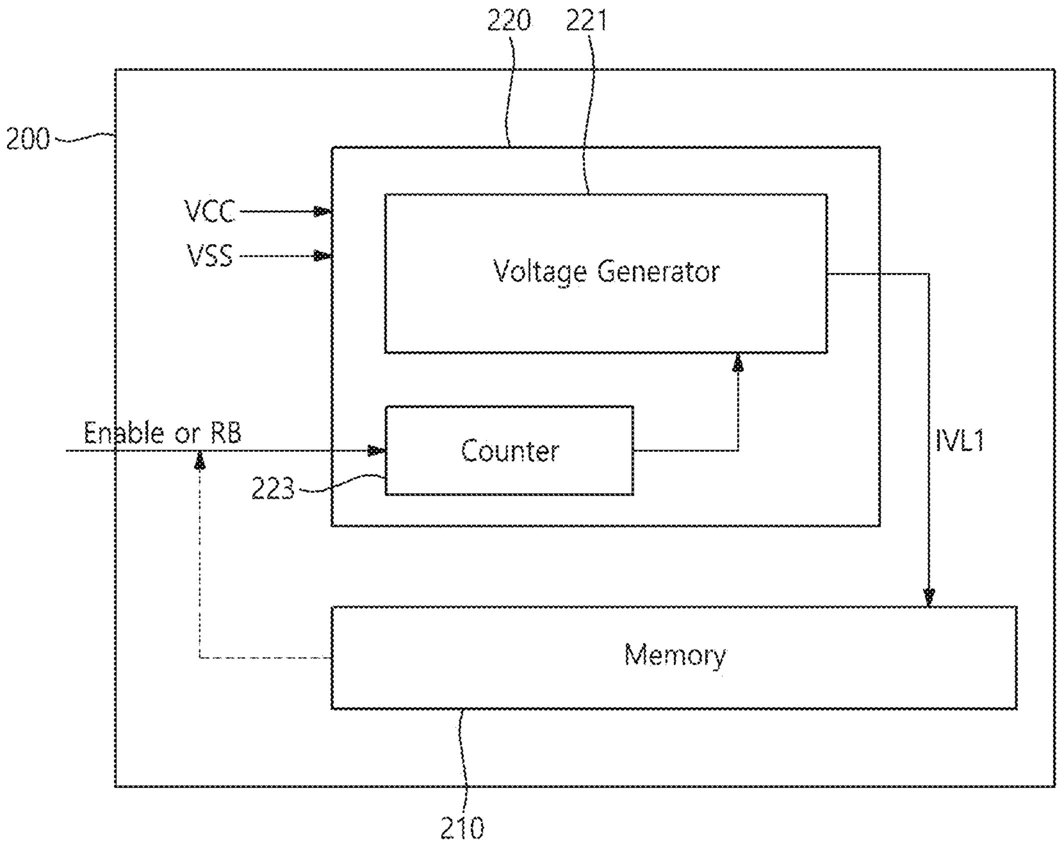
FIG. 14 is a diagram illustrating a configuration of a power supply circuit illustrated in FIG. 12, according to an embodiment of the present disclosure.

FIG. 14 is a diagram illustrating a configuration of the power supply circuit 220 illustrated in FIG. 12, according to an embodiment of the present disclosure.

Referring to FIG. 14, the power supply circuit 220 may include a voltage generator 221 and a counter 223.

The voltage generator 221 may generate the first internal driving voltage Idrv1 to the fourth internal driving voltage Idrv4. An internal driving voltage whose output is adjusted by the voltage generator 221 may be at least one of the above-mentioned internal driving voltages, but a case where the output of the first internal driving voltage Idrv1 is adjusted will be described as an example.

The voltage generator 221 may generate the first internal driving voltage Idrv1 and output the first internal driving voltage Idrv1 to the memory 210.

The voltage generator 221 may receive the operation enable signal or the operation ready signal from the outside. The counter 223 of the voltage generator 221 may perform a counting operation based on the operation enable signal or the operation ready signal. Depending on a counting value of the counter 223, the generation or output of the first internal driving voltage Idrv1 by the voltage generator 221 may be stopped.

For example, the power supply circuit 220 may adjust the output of the first internal driving voltage Idrv1 to be outputted to the memory 210, based on the operation enable signal received from the controller 300. The output of a driving voltage to be supplied to a second semiconductor die may be adjusted based on a control signal received from a first semiconductor die.

For another example, the power supply circuit 220 may adjust the output of the first internal driving voltage Idrv1 to be outputted to the memory 210, based on the operation ready signal received from the memory 210. The output of a driving voltage to be supplied to a semiconductor die may be adjusted based on a control signal received from the corresponding semiconductor die.

The counter 223 of the power supply circuit 220 may perform a counting operation according to a change in the level of the operation enable signal or the operation ready signal, and may provide a counting value to the voltage generator 221. The voltage generator 221 may stop generating or outputting the first internal driving voltage Idrv1 for a certain period based on the counting value.

Figure 15:
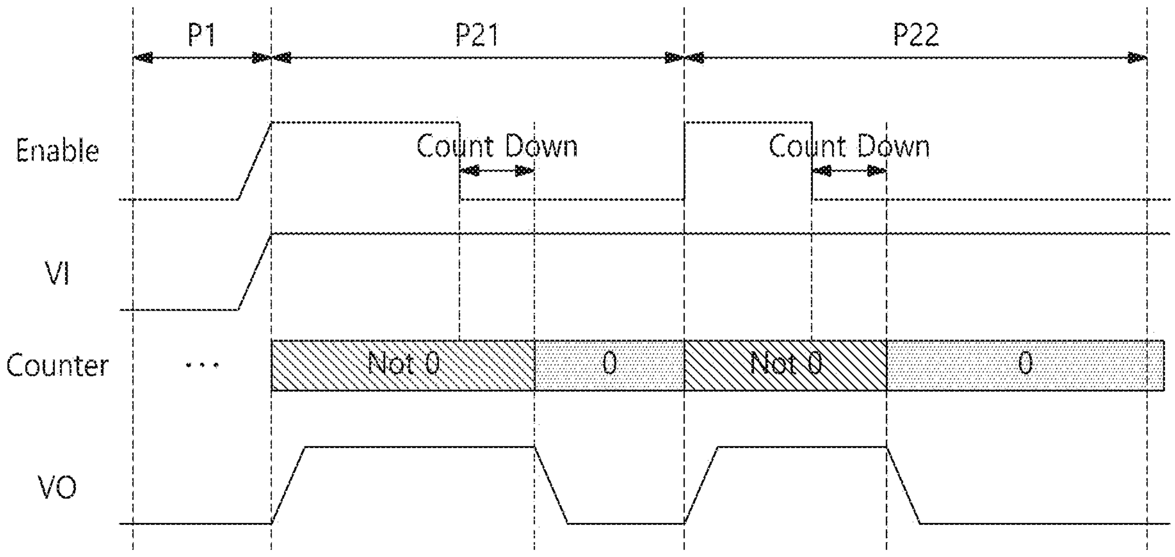
FIG. 15 is a diagram for describing an operation of the power supply circuit illustrated in FIG. 14, according to an embodiment of the present disclosure.

FIG. 15 is a diagram for describing operations of the power supply circuit 220 illustrated in FIG. 14, according to an embodiment of the present disclosure.

Referring to FIG. 15, the power supply circuit 220 may receive the operation enable signal (Enable) from the controller 300 during a first period P1. During the first period P1, the power supply circuit 220 may start to operate and start generating the first internal driving voltage Idrv1. The level of 'VI', which is a voltage generated by the voltage generator 221, may rise.

Since an example in which the power supply circuit 220 internally generates and outputs the first internal driving voltage Idrv1 is illustrated, the power supply circuit 220 may output the first internal driving voltage Idrv1 during a second period P21 and P22 after the first period P1 in which booting progresses.

A counting value of the counter 223 may be set to a reference value according to the operation enable signal inputted during the first period P1.

During a first partial period P21 of the second period P21 and P22, a counting value of the counter 223 may be maintained as the reference value during a period in which the operation enable signal maintains a high level. When the level of the operation enable signal changes from a high level to a low level during the first partial period P21, a counting operation of the counter 223 may be performed.

The counting operation of the counter 223 may be performed until a counting value reaches a target value. In a case where the counter 223 operates by decreasing a counting value, the target value may be set to 0. When a counting value becomes 0, the power supply circuit 220 may stop generating or outputting the first internal driving voltage Idrv1. 'VO', which is the level of a voltage outputted by the power supply circuit 220, may change from a high level to a low level.

The operation enable signal may change from a low level to a high level during a second partial period P22 of the second period P21 and P22.

A counting of by the counter 223 may be set again to the reference value. During the second partial period P22, a counting value may maintain the reference value during a period in which the operation enable signal maintains a high level. When the operation enable signal changes to a low level, a counting operation of the counter 223 may be performed. When a counting value reaches the target value, the generation or output of the first internal driving voltage Idrv1 may be stopped.

Although a case where the counter 223 operates according to the level of the operation enable signal has been described as an example, after booting is completed, the counter 223 may operate based on a change in the level of the operation ready signal transmitted by the memory 210. Based on a control signal outputted by the memory 210, the power supply circuit 220 may control the output of an internal driving voltage to be supplied to the memory 210.

A brief description of the embodiments of the present disclosure described above is as follows.

A semiconductor device based on an embodiment of the present disclosure may include a package substrate including a plurality of package balls; at least one memory electrically connected to a first driving voltage package ball among the plurality of package balls through a first external voltage interconnection; and a power supply circuit electrically connected to the first driving voltage package ball through the first external voltage interconnection, electrically connected to the at least one memory through a first internal voltage interconnection, and configured to adjust a voltage state of the first internal voltage interconnection depending on a voltage level of the first driving voltage package ball.

The power supply circuit may generate a first internal driving voltage, and when the voltage level of the first driving voltage package ball is equal to or higher than a level of the first internal driving voltage, may set the first internal voltage interconnection to a high impedance state.

The power supply circuit may set the first internal voltage interconnection to a high impedance state when the voltage level of the first driving voltage package ball is equal to or higher than a reference level.

The first internal voltage interconnection may be a high impedance state, and a first external driving voltage may be supplied to the at least one memory through the first external voltage interconnection.

The power supply circuit may generate a first internal driving voltage, and when the voltage level of the first driving voltage package ball is lower than a level of the first internal driving voltage, may output the first internal driving voltage to the first internal voltage interconnection.

When the voltage level of the first driving voltage package ball is lower than a reference level, the power supply circuit may output a first internal driving voltage generated therein to the first internal voltage interconnection.

While a first internal driving voltage generated from the power supply circuit is supplied to the first internal voltage interconnection, a voltage level of the first internal voltage interconnection may be higher than a voltage level of the first external voltage interconnection.

The power supply circuit may be electrically connected to a second driving voltage package ball among the plurality of package balls through a second external voltage interconnection, and may generate a first internal driving voltage to be supplied to the first internal voltage interconnection, using a second external driving voltage received through the second external voltage interconnection.

The power supply circuit may generate the first internal driving voltage by raising a voltage level of the second external driving voltage, and may generate a second internal driving voltage by lowering the voltage level of the second external driving voltage.

The power supply circuit may supply the second internal driving voltage through a second internal voltage interconnection which is electrically connected to the at least one memory and is electrically separated from the second external voltage interconnection.

The power supply circuit may set the first internal voltage interconnection to a high impedance state for a preset time, when receiving a power-on signal or an operation enable signal from an outside.

The first external voltage interconnection may be electrically connected to the first internal voltage interconnection.

A portion where the first external voltage interconnection is connected to the at least one memory may be integrated with a portion where the first internal voltage interconnection is connected to the at least one memory.

A point where the first external voltage interconnection is connected to the power supply circuit may be located between a point where the first external voltage interconnection is connected to the first driving voltage package ball and a point where the first external voltage interconnection is connected to the at least one memory.

A voltage outputted through the first internal voltage interconnection may be fed back to the power supply circuit through the first external voltage interconnection.

The power supply circuit may include a voltage generator configured to generate a first internal driving voltage; and a comparator configured to compare the first internal driving voltage and a voltage inputted through the first external voltage interconnection, and determine an output voltage.

The power supply circuit may receive an operation ready signal from the at least one memory, and when a preset time elapses after a level of the operation ready signal changes from a first level to a second level, may stop generation or output of the first internal driving voltage.

An electronic device based on an embodiment of the present disclosure may include a semiconductor package; and a power management circuit configured to supply an external driving voltage through a package ball included in the semiconductor package, the semiconductor package including at least one memory; a power supply circuit configured to supply an internal driving voltage to the at least one memory; and a first external voltage interconnection electrically connected to the at least one memory and the power supply circuit, and electrically connected to a package ball which is electrically separated from the power management circuit.

The semiconductor package may include a first internal voltage interconnection electrically connected between the at least one memory and the power supply circuit, and electrically connected to the first external voltage interconnection.

The power supply circuit may set the first internal voltage interconnection to a high impedance state for a preset time when receiving a power-on signal or an operation enable signal from an outside.

A point where the first internal voltage interconnection is connected to the at least one memory may be the same as a point where the first external voltage interconnection is connected to the at least one memory.

A first internal driving voltage may be supplied through the first internal voltage interconnection, and the first internal driving voltage may be fed back to the power supply circuit through the first external voltage interconnection.

When a voltage level fed back to the power supply circuit through the first external voltage interconnection is equal to or lower than a level of the first internal driving voltage, the power supply circuit may maintain output of the first internal driving voltage.

The semiconductor package may include a second external voltage interconnection electrically connected to a package ball which is electrically connected to the power management circuit, electrically connected to the power supply circuit, and electrically separated from the at least one memory.

The power supply circuit may receive a second external driving voltage through the second external voltage interconnection, and may output the first internal driving voltage by adjusting a level of the second external driving voltage.

The power supply circuit may receive an operation ready signal from the at least one memory, and when a preset time elapses after a level of the operation ready signal changes from a first level to a second level, may stop output of the first internal driving voltage.

An electronic device based on an embodiment of the present disclosure may include a semiconductor package; and a power management circuit configured to supply an external driving voltage through a package ball included in the semiconductor package, the semiconductor package including at least one memory; a power supply circuit configured to supply an internal driving voltage to the at least one memory; a first external voltage interconnection electrically connected between a package ball which is electrically connected to the power management circuit and the at least one memory, and electrically connected to the power supply circuit; and a first internal voltage interconnection electrically connected between the power supply circuit and the at least one memory.

The first external voltage interconnection may be electrically connected to the first internal voltage interconnection outside the power supply circuit.

The first internal voltage interconnection may be a high impedance state while a first external driving voltage is supplied to the at least one memory through the first external voltage interconnection.

The first internal voltage interconnection may be a high impedance state for a preset time before the first external driving voltage is supplied to the at least one memory.

The semiconductor package may include a second internal voltage interconnection electrically connected between the power supply circuit and the at least one memory, and a second internal driving voltage may be supplied through the second internal voltage interconnection during at least a partial period of a period in which the first internal voltage interconnection is a high impedance state.

The semiconductor package may include a second external voltage interconnection electrically connected between a package ball which is electrically connected to the power management circuit and the power supply circuit, and the second internal driving voltage may be generated using a second external driving voltage which is supplied through the second external voltage interconnection.

A power supply circuit based on an embodiment of the present disclosure may include a voltage generation circuit configured to generate a first internal driving voltage; and a voltage output circuit electrically connected to a first external voltage interconnection and a first internal voltage interconnection, and configured to compare a voltage level of the first external voltage interconnection and a level of the first internal driving voltage and set the first internal voltage interconnection to a high impedance state when the voltage level of the first external voltage interconnection is equal to or higher than the level of the first internal driving voltage.

When the voltage level of the first external voltage interconnection is lower than the level of the first internal driving voltage, the voltage output circuit may output the first internal driving voltage to the first internal voltage interconnection.

The power supply circuit may include a counter configured to operate when a level of an operation ready signal received from an outside changes from a first level to a second level, and generation or output of the first internal driving voltage may be stopped when a counting value of the counter becomes a preset target value before a level of the operation ready signal changes from the second level to the first level.

The voltage output circuit may set the first internal voltage interconnection to a high impedance state for a preset time when receiving a power-on signal or an operation enable signal from an outside.

The voltage generation circuit may receive a second external driving voltage through a second external voltage interconnection which is different from the first external voltage interconnection, and may generate the first internal driving voltage using the second external driving voltage.

The first external voltage interconnection and the first internal voltage interconnection may be electrically connected to each other outside.

A semiconductor device based on an embodiment of the present disclosure may include at least one memory; a controller configured to control an operation of the at least one memory; and a power supply circuit configured to supply an internal driving voltage to the at least one memory and the controller, wherein the power supply circuit stops generation or output of the internal driving voltage when a preset time elapses after a level of an operation signal received from at least one of the at least one memory and the controller changes from a first level to a second level.

The power supply circuit may start generation of the internal driving voltage when receiving the operation signal of the first level.

When the level of the operation signal changes from the second level to the first level before the preset time elapses, the power supply circuit may maintain the generation or the output of the internal driving voltage.

The power supply circuit may include a counter which operates based on the operation signal, and, when receiving the operation signal, may set a counting value of the counter to a reference value.

The power supply circuit may maintain the counting of by the counter as the reference value during a period in which the level of the operation signal is the first level.

The power supply circuit may start a counting operation of the counter when the level of the operation signal changes to the second level, and may stop the generation or the output of the internal driving voltage when the counting value of the counter reaches a preset target value.

The preset target value may be equal to or greater than a delay value according to an erase operation for the at least one memory.

When the level of the operation signal changes from the second level to the first level, the power supply circuit may set the counting value of the counter to the reference value again.

A semiconductor device based on an embodiment of the present disclosure may include at least one memory; and a power supply circuit configured to supply an internal driving voltage to the at least one memory, receive an operation ready signal from the at least one memory, and when a preset time elapses after a level of the operation ready signal changes from a first level to a second level, stop the supply of the internal driving voltage.

The semiconductor device may include a package substrate having disposed thereon the at least one memory and the power supply circuit, and including a plurality of package balls, and the power supply circuit may be electrically connected to a first external voltage interconnection which is electrically connected to a first driving voltage package ball among the plurality of package balls, may be electrically connected to a second external voltage interconnection which is electrically connected to a second driving voltage package ball, and may generate the internal driving voltage using an external driving voltage which is inputted through the second external voltage interconnection.

The second driving voltage package ball may be electrically connected to a power management circuit which is located outside, and the first driving voltage package ball may be electrically separated from the power management circuit.

The first external voltage interconnection may connect the power supply circuit and the at least one memory, and may be electrically connected to a first internal voltage interconnection to which the internal driving voltage is supplied.

The first internal voltage interconnection may be set to a high impedance state when receiving a power-on signal from an outside, and a voltage level of the first internal voltage interconnection may rise when the operation ready signal of the first level is received.

An electronic device based on an embodiment of the present disclosure may include a semiconductor package; and a power management circuit configured to supply an external driving voltage to the semiconductor package, the semiconductor package including at least one memory; and a power supply circuit configured to generate an internal driving voltage using the external driving voltage, supply the internal driving voltage to the at least one memory, and stop the supply of the internal driving voltage during at least a period other than an active period of the at least one memory, based on an operation state of the at least one memory.

The power supply circuit may stop the generation or the output of the internal driving voltage when a preset time elapses after a level of an operation enable signal received from a controller located inside or outside the semiconductor package changes from a first level to a second level.

The power supply circuit may stop the generation or the output of the internal driving voltage when a preset time elapses after a level of an operation enable signal received from the at least one memory changes from a first level to a second level.

The preset time may be equal to or longer than a delay time according to an erase operation for the at least one memory.

The semiconductor package may include a dummy package ball electrically separated from the power management circuit and electrically connected to the power supply circuit.

The dummy package ball may be electrically connected to the at least one memory.

The dummy package ball may be electrically connected to an interconnection through which the internal driving voltage is supplied to the at least one memory.

A power supply circuit based on an embodiment of the present disclosure may include a voltage generation circuit configured to generate an internal driving voltage using an external driving voltage; and a voltage output circuit configured to output the internal driving voltage based on an operation signal received from an outside, and stop output of the internal driving voltage when a preset time elapses after a level of the operation signal changes from a first level to a second level.

The voltage output circuit may receive the operation signal from a semiconductor die, and may supply the internal driving voltage to the semiconductor die.

The voltage output circuit may output a first internal driving voltage to a first semiconductor die, may output a second internal driving voltage to a second semiconductor die, and may control output of the first internal driving voltage based on the operation signal received from the second semiconductor die.

Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the present disclosure as defined in the following claims. Furthermore, the embodiments may be combined to form additional embodiments.

What is claimed is:

1. A semiconductor device comprising:

a package substrate including a plurality of package balls;

at least one memory electrically connected to a first driving voltage package ball among the plurality of package balls through a first external voltage interconnection; and a power supply circuit electrically connected to the first driving voltage package ball through the first external voltage interconnection, electrically connected to the at least one memory through a first internal voltage interconnection, and configured to adjust a voltage state of the first internal voltage interconnection based on a voltage level of the first driving voltage package ball, wherein the power supply circuit is configured to:

generate a first internal driving voltage; and set the first internal voltage interconnection to a high impedance state when the voltage level of the first driving voltage package ball is equal to or higher than a level of the first internal driving voltage or when the voltage level of the first driving voltage package ball is equal to or higher than a reference level.

2. The semiconductor device according to claim 1, wherein, the first internal voltage interconnection is the high impedance state, when a first external driving voltage is supplied to the at least one memory through the first external voltage interconnection.

3. The semiconductor device according to claim 1, wherein the power supply circuit is configured to:

output the first internal driving voltage to the first internal voltage interconnection when the voltage level of the first driving voltage package ball is lower than a level of the first internal driving voltage or when the voltage level of the first driving voltage package ball is lower than the reference level.

4. The semiconductor device according to claim 1, wherein, while the first internal driving voltage generated from the power supply circuit is supplied to the first internal voltage interconnection, a voltage level of the first internal voltage interconnection is higher than a voltage level of the first external voltage interconnection.

5. The semiconductor device according to claim 1, wherein the power supply circuit is electrically connected to a second driving voltage package ball among the plurality of package balls through a second external voltage interconnection, and is configured to generate, based on a second external driving voltage received through the second external voltage interconnection, the first internal driving voltage to be supplied to the first internal voltage interconnection.

6. The semiconductor device according to claim 5, wherein the power supply circuit is configured to generate the first internal driving voltage by raising a voltage level of the second external driving voltage, and generate a second internal driving voltage by lowering the voltage level of the second external driving voltage.

7. The semiconductor device according to claim 6, wherein the power supply circuit is configured to supply the second internal driving voltage through a second internal voltage interconnection which is electrically connected to the at least one memory and is electrically separated from the second external voltage interconnection.

8. The semiconductor device according to claim 1, wherein the power supply circuit is configured to set the first internal voltage interconnection to the high impedance state for a preset time when externally receiving a power-on signal or an operation enable signal.

9. The semiconductor device according to claim 1, wherein the first external voltage interconnection is electrically connected to the first internal voltage interconnection.

10. The semiconductor device according to claim 1, wherein the first external voltage interconnection is connected to the at least one memory through the first internal voltage interconnection.

11. The semiconductor device according to claim 1, wherein a point where the first external voltage interconnection is connected to the power supply circuit is located between a point where the first external voltage interconnection is connected to the first driving voltage package ball and a point where the first external voltage interconnection is connected to the at least one memory.

12. The semiconductor device according to claim 1, wherein a voltage outputted through the first internal voltage interconnection is fed back to the power supply circuit through the first external voltage interconnection.

13. The semiconductor device according to claim 1, wherein the power supply circuit comprises:

a voltage generator configured to generate the first internal driving voltage; and a comparator configured to compare the first internal driving voltage with a voltage inputted through the first external voltage interconnection to determine an output voltage, and wherein the power supply circuit is configured to:

receive an operation ready signal from the at least one memory; and stop the generation or the output of the first internal driving voltage when a preset time elapses after a level of the operation ready signal changes from a first level to a second level.

14. An electronic device comprising:

a semiconductor package; and a power management circuit configured to supply an external driving voltage through a package ball included in the semiconductor package, wherein the semiconductor package comprises:

at least one memory;

a power supply circuit configured to supply an internal driving voltage to the at least one memory; and a first external voltage interconnection electrically connected to the at least one memory and the power supply circuit, and electrically connected to a package ball which is electrically separated from the power management circuit, wherein the external driving voltage is not supplied to the package ball which is electrically connected to the first external voltage interconnection.

15. The electronic device according to claim 14, wherein the semiconductor package further comprises a first internal voltage interconnection electrically connected between the at least one memory and the power supply circuit, and electrically connected to the first external voltage interconnection.

16. The electronic device according to claim 15, wherein the power supply circuit is configured to set the first internal voltage interconnection to a high impedance state for a preset time when externally receiving a power-on signal or an operation enable signal.

17. The electronic device according to claim 15, wherein:

a first internal driving voltage is supplied through the first internal voltage interconnection; and the first internal driving voltage is fed back to the power supply circuit through the first external voltage interconnection, and wherein, when a voltage level fed back to the power supply circuit through the first external voltage interconnection is equal to or lower than a level of the first internal driving voltage, the power supply circuit is configured to maintain output of the first internal driving voltage.

18. The electronic device according to claim 17, wherein the semiconductor package further comprises a second external voltage interconnection electrically connected to a package ball which is electrically connected to the power management circuit, electrically connected to the power supply circuit, and electrically separated from the at least one memory, and wherein the power supply circuit is configured to:

receive a second external driving voltage through the second external voltage interconnection; and output the first internal driving voltage by adjusting a level of the second external driving voltage.

19. An electronic device comprising:

a semiconductor package; and a power management circuit configured to supply an external driving voltage through a package ball included in the semiconductor package, wherein the semiconductor package comprises:

at least one memory;

a power supply circuit configured to supply an internal driving voltage to the at least one memory;

a first external voltage interconnection electrically connected between a package ball which is electrically connected to the power management circuit and the at least one memory, and electrically connected to the power supply circuit; and a first internal voltage interconnection electrically connected between the power supply circuit and the at least one memory, wherein the power supply circuit is configured to:

generate a first internal driving voltage; and set the first internal voltage interconnection to a high impedance state when the voltage level of the package ball electrically connected to the first external voltage interconnection is equal to or higher than a level of the first internal driving voltage or when the voltage level of the package ball electrically connected to the first external voltage interconnection is equal to or higher than a reference level.

* * * * *